US012183834B2

(12) United States Patent
Salahuddin et al.

(10) Patent No.: US 12,183,834 B2
(45) Date of Patent: *Dec. 31, 2024

(54) COOL ELECTRON ERASING IN THIN-FILM STORAGE TRANSISTORS

(71) Applicant: SUNRISE MEMORY CORPORATION, San Jose, CA (US)

(72) Inventors: Sayeef Salahuddin, Walnut Creek, CA (US); George Samachisa, Atherton, CA (US); Wu-Yi Henry Chien, San Jose, CA (US); Eli Harari, Saratoga, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 51 days.

This patent is subject to a terminal disclaimer.

(21) Appl. No.: 18/046,433

(22) Filed: Oct. 13, 2022

(65) Prior Publication Data
US 2023/0065451 A1    Mar. 2, 2023

Related U.S. Application Data

(63) Continuation of application No. 17/155,673, filed on Jan. 22, 2021, now Pat. No. 11,515,432.
(Continued)

(51) Int. Cl.
*H01L 29/792* (2006.01)
*H01L 29/423* (2006.01)
(Continued)

(52) U.S. Cl.
CPC ........ *H01L 29/792* (2013.01); *H01L 29/4234* (2013.01); *H01L 29/513* (2013.01); *H01L 29/517* (2013.01); *H10B 43/30* (2023.02)

(58) Field of Classification Search
CPC ............. H01L 27/11568; H01L 29/513; H01L 21/8239
See application file for complete search history.

(56) References Cited

U.S. PATENT DOCUMENTS 4,213,139 A    7/1980  Rao
5,583,808 A    12/1996 Brahmbhatt
(Continued)

FOREIGN PATENT DOCUMENTS

CN    101615618 A     12/2009
JP    2004079606 A    3/2004
(Continued)

OTHER PUBLICATIONS

Liao, C.Y., et al., "Multibit Ferroelectric FET Based on Nonidentical Double HfZrO2 for High-Density Nonvolatile Memory", IEEE Electron Device Letters, vol. 42, No. 4, doi: 10.1109/LED.2021.3060589., Apr. 2021, pp. 617-620.
(Continued)

*Primary Examiner* — Mohammad M Choudhry
(74) *Attorney, Agent, or Firm* — Edward C. Kwok; VLP Law Group LLP

(57) ABSTRACT

A storage transistor has a tunnel dielectric layer and a charge-trapping layer between a channel region and a gate electrode, wherein the charge-tapping layer has a conduction band offset that is less than the lowering of the tunneling barrier in the tunnel dielectric layer when a programming voltage is applied, such that electrons direct tunnel into the charge-trapping layer. The conduction band of the charge-trapping layer has a value between −1.0 eV and 2.3 eV. The storage transistor may further include a barrier layer between the tunnel dielectric layer and the charge-trapping layer, the barrier layer having a conduction band offset less than the conduction band offset of the charge-trapping layer.

33 Claims, 13 Drawing Sheets

Related U.S. Application Data

(60) Provisional application No. 62/992,754, filed on Mar. 20, 2020, provisional application No. 62/964,472, filed on Jan. 22, 2020.

(51) Int. Cl.
*H01L 29/51* (2006.01)
*H10B 43/30* (2023.01)

(56) References Cited

U.S. PATENT DOCUMENTS

| | | |
|---|---|---|
| 5,646,886 A | 7/1997 | Brahmbhatt |
| 5,656,842 A | 8/1997 | Iwamatsu |
| 5,768,192 A | 6/1998 | Eitan |
| 5,789,776 A | 8/1998 | Lancaster et al. |
| 5,880,993 A | 3/1999 | Kramer et al. |
| 5,915,167 A | 6/1999 | Leedy |
| 6,040,605 A | 3/2000 | Sano et al. |
| 6,107,133 A | 8/2000 | Furukawa et al. |
| 6,118,171 A | 9/2000 | Davies et al. |
| 6,130,838 A | 10/2000 | Kim et al. |
| 6,313,518 B1 | 11/2001 | Ahn et al. |
| 6,314,046 B1 | 11/2001 | Kamiya et al. |
| 6,362,508 B1 | 3/2002 | Rasovaky et al. |
| 6,434,053 B1 | 8/2002 | Fujiwara |
| 6,580,124 B1 | 6/2003 | Cleeves et al. |
| 6,627,503 B2 | 9/2003 | Ma |
| 6,744,094 B2 | 6/2004 | Forbes |
| 6,754,105 B1 | 6/2004 | Chang et al. |
| 6,774,458 B2 | 8/2004 | Fricke et al. |
| 6,873,004 B1 | 3/2005 | Han et al. |
| 6,881,994 B2 | 4/2005 | Lee et al. |
| 6,946,703 B2 | 9/2005 | Ryu et al. |
| 7,005,350 B2 | 2/2006 | Walker et al. |
| 7,223,653 B2 | 5/2007 | Cheng et al. |
| 7,307,308 B2 | 12/2007 | Lee |
| 7,465,980 B2 | 12/2008 | Arimoto et al. |
| 7,489,002 B2 | 2/2009 | Forbes et al. |
| 7,512,012 B2 | 3/2009 | Kuo |
| 7,524,725 B2 | 4/2009 | Chung |
| 7,542,348 B1 | 6/2009 | Kim |
| 7,612,411 B2 | 11/2009 | Walker |
| 7,709,359 B2 | 5/2010 | Boes et al. |
| 7,804,145 B2 | 9/2010 | Shimizu et al. |
| 7,872,295 B2 | 1/2011 | Park et al. |
| 7,898,009 B2 | 3/2011 | Wilson et al. |
| 8,026,521 B1 | 9/2011 | Or-Bach et al. |
| 8,139,418 B2 | 3/2012 | Carman |
| 8,178,396 B2 | 5/2012 | Sinha et al. |
| 8,242,504 B2 | 8/2012 | Kim |
| 8,278,183 B2 | 10/2012 | Lerner |
| 8,304,823 B2 | 11/2012 | Boescke |
| 8,383,482 B2 | 2/2013 | Kim et al. |
| 8,395,942 B2 | 3/2013 | Samachisa et al. |
| 8,630,114 B2 | 1/2014 | Lue |
| 8,743,612 B2 | 6/2014 | Choi et al. |
| 8,767,436 B2 | 7/2014 | Scalia et al. |
| 8,767,473 B2 | 7/2014 | Shim et al. |
| 8,848,425 B2 | 9/2014 | Schloss |
| 8,878,278 B2 | 11/2014 | Alsmeier et al. |
| 9,053,801 B2 | 6/2015 | Sandhu et al. |
| 9,053,802 B2 | 6/2015 | Mueller |
| 9,190,293 B2 | 11/2015 | Wang et al. |
| 9,202,694 B2 | 12/2015 | Konevecki et al. |
| 9,219,225 B2 | 12/2015 | Karda et al. |
| 9,230,985 B1 | 1/2016 | Wu et al. |
| 9,231,206 B2 | 1/2016 | Tao et al. |
| 9,263,577 B2 | 2/2016 | Ramaswamy et al. |
| 9,281,044 B2 | 3/2016 | Ramaswamy et al. |
| 9,337,210 B2 | 5/2016 | Karda et al. |
| 9,362,487 B2 | 6/2016 | Inumiya et al. |
| 9,391,084 B2 | 7/2016 | Lue |
| 9,412,752 B1 | 8/2016 | Yeh et al. |
| 9,443,861 B1 | 9/2016 | Pachamuthu et al. |
| 9,455,268 B2 | 9/2016 | Oh et al. |
| 9,472,560 B2 | 10/2016 | Ramaswamy et al. |
| 9,530,794 B2 | 12/2016 | Ramaswamy et al. |
| 9,558,804 B2 | 1/2017 | Mue |
| 9,620,605 B2 | 4/2017 | Liang et al. |
| 9,633,944 B2 | 4/2017 | Kim |
| 9,698,152 B2 | 7/2017 | Peri |
| 9,711,529 B2 | 7/2017 | Hu et al. |
| 9,748,172 B2 | 8/2017 | Takaki |
| 9,786,684 B2 | 10/2017 | Ramaswamy et al. |
| 9,799,761 B2 | 10/2017 | Or-Bach et al. |
| 9,818,468 B2 | 11/2017 | Müller |
| 9,818,848 B2 | 11/2017 | Sun et al. |
| 9,830,969 B2 | 11/2017 | Slesazeck et al. |
| 9,842,651 B2 | 12/2017 | Harari |
| 9,865,680 B2 | 1/2018 | Okumura et al. |
| 9,875,784 B1 | 1/2018 | Li et al. |
| 9,876,018 B2 | 1/2018 | Chavan et al. |
| 9,892,800 B2 | 2/2018 | Harari |
| 9,911,497 B1 | 3/2018 | Harari |
| 9,941,299 B1 | 4/2018 | Chen et al. |
| 10,014,317 B2 | 7/2018 | Peng |
| 10,038,092 B1 | 7/2018 | Chen et al. |
| 10,043,567 B2 | 8/2018 | Slesazeck et al. |
| 10,056,393 B2 | 8/2018 | Schroeder et al. |
| 10,074,667 B1 | 9/2018 | Higashi |
| 10,090,036 B2 | 10/2018 | Van Houdt |
| 10,096,364 B2 | 10/2018 | Harari |
| 10,121,553 B2 | 11/2018 | Harari |
| 10,157,780 B2 | 12/2018 | Wu et al. |
| 10,211,223 B2 | 2/2019 | Van Houdt et al. |
| 10,211,312 B2 | 2/2019 | Van Houdt et al. |
| 10,217,667 B2 | 2/2019 | Or-Bach et al. |
| 10,249,370 B2 | 4/2019 | Harari |
| 10,254,968 B1 | 4/2019 | Gazit et al. |
| 10,283,493 B1 | 5/2019 | Nishida |
| 10,319,696 B1 | 6/2019 | Nakano |
| 10,355,121 B2 | 7/2019 | Or-Bach et al. |
| 10,373,956 B2 | 8/2019 | Gupta et al. |
| 10,381,370 B2 | 8/2019 | Shin et al. |
| 10,381,378 B1 | 8/2019 | Harari |
| 10,395,737 B2 | 8/2019 | Harari |
| 10,403,627 B2 | 9/2019 | Van Houdt et al. |
| 10,418,377 B2 | 9/2019 | Van Houdt et al. |
| 10,424,379 B2 | 9/2019 | Slesazeck et al. |
| 10,431,596 B2 | 10/2019 | Herner et al. |
| 10,438,645 B2 | 10/2019 | Muell et al. |
| 10,460,788 B2 | 10/2019 | Mueller |
| 10,475,812 B2 | 11/2019 | Harari |
| 10,510,773 B2 | 12/2019 | Ramaswamy et al. |
| 10,600,808 B2 | 3/2020 | Schröder et al. |
| 10,608,008 B2 | 3/2020 | Harari et al. |
| 10,608,011 B2 | 3/2020 | Harari et al. |
| 10,622,051 B2 | 4/2020 | Mueller et al. |
| 10,622,377 B2 | 4/2020 | Harari et al. |
| 10,636,471 B2 | 4/2020 | Ramaswamy et al. |
| 10,650,892 B2 | 5/2020 | Noack |
| 10,651,153 B2 | 5/2020 | Fastow et al. |
| 10,651,182 B2 | 5/2020 | Morris et al. |
| 10,692,837 B1 | 6/2020 | Nguyen et al. |
| 10,692,874 B2 | 6/2020 | Harari et al. |
| 10,700,093 B1 | 6/2020 | Kalitsov et al. |
| 10,720,437 B2 | 7/2020 | Yoo |
| 10,825,834 B1 | 11/2020 | Chen |
| 10,872,905 B2 | 12/2020 | Muel |
| 10,879,269 B1 | 12/2020 | Zhang et al. |
| 10,896,711 B2 | 1/2021 | Lee et al. |
| 10,937,482 B2 | 3/2021 | Sharma et al. |
| 10,950,616 B2 | 3/2021 | Harari et al. |
| 2001/0030340 A1 | 10/2001 | Fujiwara |
| 2001/0053092 A1 | 12/2001 | Kosaka et al. |
| 2002/0012271 A1 | 1/2002 | Forbes |
| 2002/0028541 A1 | 3/2002 | Lee et al. |
| 2002/0051378 A1 | 5/2002 | Ohsawa |
| 2002/0193484 A1 | 12/2002 | Albee |
| 2003/0038318 A1 | 2/2003 | Forbes |
| 2004/0214387 A1 | 10/2004 | Madurawe et al. |
| 2004/0246807 A1 | 12/2004 | Lee |
| 2004/0262681 A1 | 12/2004 | Masuoka et al. |
| 2004/0262772 A1 | 12/2004 | Ramanathan et al. |

(56) References Cited

U.S. PATENT DOCUMENTS

| | | |
|---|---|---|
| 2004/0264247 A1 | 12/2004 | Kim |
| 2005/0128815 A1 | 6/2005 | Ishikawa et al. |
| 2005/0280061 A1 | 12/2005 | Lee |
| 2006/0001083 A1 | 1/2006 | Bhattacharyya |
| 2006/0155921 A1 | 7/2006 | Gorobets et al. |
| 2006/0189154 A1* | 8/2006 | Ahn .................. C23C 16/405 438/785 |
| 2006/0261404 A1 | 11/2006 | Forbes |
| 2007/0023817 A1 | 2/2007 | Dao |
| 2007/0045711 A1* | 3/2007 | Bhattacharyya ........................... H01L 29/42348 257/E21.21 |
| 2007/0134876 A1 | 6/2007 | Lai et al. |
| 2008/0032465 A1* | 2/2008 | Ahn .................. H01L 21/0228 257/E21.267 |
| 2008/0054346 A1 | 3/2008 | Saitoh et al. |
| 2008/0160765 A1 | 7/2008 | Lee et al. |
| 2008/0178794 A1 | 7/2008 | Cho et al. |
| 2008/0239812 A1 | 10/2008 | Naofumi et al. |
| 2008/0266960 A1 | 10/2008 | Kuo |
| 2008/0291723 A1 | 11/2008 | Wang et al. |
| 2008/0301359 A1 | 12/2008 | Smith |
| 2009/0057722 A1 | 3/2009 | Masuoka et al. |
| 2009/0140318 A1 | 6/2009 | Dong |
| 2009/0157946 A1 | 6/2009 | Arya |
| 2009/0237996 A1 | 9/2009 | Kirsch et al. |
| 2009/0268519 A1 | 10/2009 | Ishi |
| 2009/0279360 A1 | 11/2009 | Peter et al. |
| 2009/0290442 A1 | 11/2009 | Rajan |
| 2009/0316487 A1 | 12/2009 | Lee et al. |
| 2010/0121994 A1 | 5/2010 | Kim et al. |
| 2010/0124116 A1 | 5/2010 | Takashi et al. |
| 2010/0128509 A1 | 5/2010 | Kim et al. |
| 2010/0148215 A1 | 6/2010 | Schulze et al. |
| 2010/0219392 A1 | 9/2010 | Awaya et al. |
| 2010/0254191 A1 | 10/2010 | Son et al. |
| 2011/0003418 A1 | 1/2011 | Sakata et al. |
| 2011/0044113 A1 | 2/2011 | Kim |
| 2011/0075486 A1 | 3/2011 | Liao et al. |
| 2011/0115011 A1 | 5/2011 | Masuoka et al. |
| 2011/0134705 A1 | 6/2011 | Jones et al. |
| 2011/0170266 A1 | 7/2011 | Haensh et al. |
| 2011/0208905 A1 | 8/2011 | Shaeffer et al. |
| 2011/0298013 A1 | 12/2011 | Hwang et al. |
| 2011/0310683 A1 | 12/2011 | Gorobets |
| 2012/0063223 A1 | 3/2012 | Lee |
| 2012/0146126 A1 | 6/2012 | Lai et al. |
| 2012/0182801 A1 | 7/2012 | Lue |
| 2012/0243314 A1 | 9/2012 | Takashi |
| 2012/0307568 A1 | 12/2012 | Banna et al. |
| 2012/0327714 A1 | 12/2012 | Lue |
| 2013/0031325 A1 | 1/2013 | Nakamoto et al. |
| 2013/0178031 A1 | 7/2013 | Ramkumar et al. |
| 2013/0256780 A1 | 10/2013 | Kai et al. |
| 2014/0006688 A1* | 1/2014 | Yu .................. G06F 12/0246 365/185.03 |
| 2014/0015036 A1 | 1/2014 | Fursin et al. |
| 2014/0040698 A1 | 2/2014 | Loh et al. |
| 2014/0070290 A1 | 3/2014 | Inumiya et al. |
| 2014/0075135 A1 | 3/2014 | Choi et al. |
| 2014/0112075 A1 | 4/2014 | Dunga et al. |
| 2014/0117366 A1 | 5/2014 | Saitoh |
| 2014/0151774 A1 | 6/2014 | Rhie |
| 2014/0213032 A1 | 7/2014 | Kai et al. |
| 2014/0229131 A1 | 8/2014 | Cohen et al. |
| 2014/0247674 A1 | 9/2014 | Karda et al. |
| 2014/0328128 A1 | 11/2014 | Louie et al. |
| 2014/0340952 A1 | 11/2014 | Ramaswamy et al. |
| 2014/0355328 A1 | 12/2014 | Muller et al. |
| 2015/0054507 A1 | 2/2015 | Gulaka et al. |
| 2015/0098272 A1 | 4/2015 | Kasolra et al. |
| 2015/0113214 A1 | 4/2015 | Sutardja |
| 2015/0155876 A1 | 6/2015 | Jayasena et al. |
| 2015/0194440 A1 | 7/2015 | Noh et al. |
| 2015/0249143 A1 | 9/2015 | Sano |
| 2015/0263005 A1 | 9/2015 | Zhao et al. |
| 2015/0372099 A1 | 12/2015 | Chen et al. |
| 2016/0013156 A1 | 1/2016 | Zhai et al. |
| 2016/0019951 A1 | 1/2016 | Park et al. |
| 2016/0035711 A1 | 2/2016 | Hu |
| 2016/0086970 A1 | 3/2016 | Peng |
| 2016/0118404 A1 | 4/2016 | Peng |
| 2016/0141294 A1 | 5/2016 | Peri et al. |
| 2016/0225860 A1 | 8/2016 | Karda et al. |
| 2016/0276360 A1 | 9/2016 | Doda et al. |
| 2016/0300724 A1 | 10/2016 | Levy et al. |
| 2016/0314042 A1 | 10/2016 | Plants |
| 2017/0053906 A1 | 2/2017 | Or-Bach et al. |
| 2017/0062456 A1 | 3/2017 | Sugino et al. |
| 2017/0092370 A1 | 3/2017 | Harari |
| 2017/0092371 A1* | 3/2017 | Harari .............. H01L 29/66833 |
| 2017/0140807 A1 | 5/2017 | Sun et al. |
| 2017/0148517 A1 | 5/2017 | Harari |
| 2017/0148810 A1 | 5/2017 | Kai et al. |
| 2017/0213821 A1 | 7/2017 | Or-Bach et al. |
| 2017/0358594 A1 | 12/2017 | Lu et al. |
| 2018/0006044 A1 | 1/2018 | Chavan et al. |
| 2018/0095127 A1 | 4/2018 | Pappu et al. |
| 2018/0108416 A1 | 4/2018 | Harari |
| 2018/0261613 A1 | 9/2018 | Ariyoshi et al. |
| 2018/0269229 A1 | 9/2018 | Or-Bach et al. |
| 2018/0331042 A1 | 11/2018 | Manusharow et al. |
| 2018/0342455 A1 | 11/2018 | Nosho et al. |
| 2018/0342527 A1 | 11/2018 | Yang et al. |
| 2018/0366471 A1 | 12/2018 | Harari et al. |
| 2018/0366485 A1 | 12/2018 | Harari |
| 2018/0366489 A1 | 12/2018 | Harari et al. |
| 2018/0374929 A1 | 12/2018 | Yoo |
| 2019/0006009 A1 | 1/2019 | Harari |
| 2019/0006015 A1 | 1/2019 | Norman et al. |
| 2019/0019564 A1 | 1/2019 | Li et al. |
| 2019/0067327 A1 | 2/2019 | Herner et al. |
| 2019/0157296 A1 | 5/2019 | Harari et al. |
| 2019/0180821 A1 | 6/2019 | Harari |
| 2019/0206890 A1 | 7/2019 | Harari et al. |
| 2019/0214077 A1 | 7/2019 | Oh et al. |
| 2019/0237470 A1 | 8/2019 | Mine et al. |
| 2019/0238134 A1 | 8/2019 | Lee et al. |
| 2019/0244971 A1 | 8/2019 | Harari |
| 2019/0259769 A1 | 8/2019 | Karda et al. |
| 2019/0303042 A1 | 10/2019 | Kim et al. |
| 2019/0325945 A1 | 10/2019 | Linus |
| 2019/0325964 A1 | 10/2019 | Harari |
| 2019/0319044 A1 | 11/2019 | Harari |
| 2019/0348424 A1 | 11/2019 | Karda et al. |
| 2019/0355747 A1 | 11/2019 | Herner et al. |
| 2019/0370117 A1 | 12/2019 | Fruchtman et al. |
| 2020/0020718 A1 | 1/2020 | Harari et al. |
| 2020/0051990 A1 | 2/2020 | Harari et al. |
| 2020/0065647 A1 | 2/2020 | Mulaosmanovic et al. |
| 2020/0075631 A1 | 3/2020 | Dong |
| 2020/0098738 A1 | 3/2020 | Herner et al. |
| 2020/0098779 A1 | 3/2020 | Cernea et al. |
| 2020/0176468 A1 | 6/2020 | Herner et al. |
| 2020/0203378 A1 | 6/2020 | Harari et al. |
| 2020/0219572 A1 | 7/2020 | Harari |
| 2020/0258897 A1 | 8/2020 | Yan et al. |
| 2020/0350324 A1 | 11/2020 | Hoffman |
| 2020/0357453 A1 | 11/2020 | Slesazeck et al. |
| 2020/0357455 A1 | 11/2020 | Noack et al. |
| 2020/0357470 A1 | 11/2020 | Noack |
| 2020/0388313 A1 | 12/2020 | Cho et al. |
| 2020/0388711 A1 | 12/2020 | Doyle et al. |
| 2020/0403002 A1 | 12/2020 | Harari |
| 2020/0411533 A1 | 12/2020 | Alsmeier et al. |
| 2021/0005238 A1 | 1/2021 | Mueller |
| 2021/0013224 A1 | 1/2021 | Purayath et al. |
| 2021/0020659 A1 | 1/2021 | Chen |
| 2021/0066502 A1 | 3/2021 | Karda et al. |
| 2021/0074725 A1 | 3/2021 | Lue |

(56) References Cited

U.S. PATENT DOCUMENTS

| | | |
|---|---|---|
| 2021/0074726 A1 | 3/2021 | Lue |
| 2021/0111179 A1 | 4/2021 | Shivaraman et al. |

FOREIGN PATENT DOCUMENTS

| | | | |
|---|---|---|---|
| JP | 2006099827 A1 | 4/2006 | |
| JP | 2010074096 A * | 4/2010 | ....... H01L 21/28282 |
| JP | 2010108522 A1 | 5/2010 | |
| JP | 2010251572 A | 11/2010 | |
| JP | 2011028540 A1 | 2/2011 | |
| KR | 20120085591 A1 | 8/2012 | |
| KR | 20120085603 A | 8/2012 | |
| WO | 2018236937 A1 | 12/2018 | |
| WO | 2019066948 A1 | 4/2019 | |

OTHER PUBLICATIONS

Materano, Monica, et al., "Interplay between oxygen defects and dopants: effect on structure and performance of HfO2-based ferroelectrics", Inorg. Chem. Front. (8), Apr. 9, 2021, pp. 2650-2672.

Mo, Fei, et al., "Experimental Demonstration of Ferroelectric HfO2 FET with Ultrathin-body IGZO for High-Density and Low-Power Memory Application", 2019 Symposium on VLSI Technology, 3, doi: 10.23919/VLSIT.2019.8776553., 2019, pp. T42-T4.

Mo, Fei, et al., "Low-Voltage Operating Ferroelectric FET with Ultrathin IGZO Channel for High-Density Memory Application", IEEE Journal of the Electron Devices Society, vol. 8, doi: 10.1109/JEDS.2020.3008789., Jul. 13, 2020, pp. 717-723.

Mueller, S., et al., "Development Status of Gate-First FeFET Technology", 2021 Symposium on VLSI Technology, Jun. 2021, 2 pages.

Müller, J., et al., "Ferroelectric hafnium oxide: A CMOS-compatible and highly scalable approach to future ferroelectric memories", 2013 IEEE International Electron Devices Meeting, Washington, DC, USA, doi: 10.1109/IEDM.2013.6724605., 2013, pp. 10.8.1-10.8.4.

Nguyen, Manh-Cuong, et al., "Wakeup-Free and Endurance-Robust Ferroelectric Field-Effect Transistor Memory Using High Pressure Annealing", IEEE Electron Device Letters, vol. 42, No. 9, doi: 10.1109/LED.2021.3096248., Sep. 2021, pp. 1295-1298.

On, Nuri, et al., "Boosting carrier mobility and stability in indium-zinc-tin oxide thin-film transistors through controlled crystallization", Sci Rep 10, 18868, https://doi.org/10.1038/s41598-020-76046-w, 2020, 16 pages.

Park, Min Hyuk, et al., "Review of defect chemistry in fluorite-structure ferroelectrics for future electronic devices", J. Mater. Chem. C, vol. 8, No. 31 10526-10550, Jun. 9, 2020., Aug. 21, 2020, pp. 10526-10550.

Rios, Rafael, et al., "A Physically Based Compact Model for IGZO Transistors", IEEE Transactions on Electron Devices, vol. 68, No. 4, doi: 10.1109/TED.2021.3059387., Apr. 2021, pp. 1664-1669.

Saitoh, Masumi, et al., "HfO2-based FeFET and FTJ for Ferroelectric-Memory Centric 3D LSI towards Low-Power and High-Density Storage and AI Applications", 2020 IEEE International Electron Devices Meeting (IEDM), doi: 10.1109/IEDM13553.2020.9372106., 2020, pp. 18.1.1-18.1.4.

Salahuddin, Sayeef, et al., "FeFETs for Near-Memory and In-Memory Compute", 2021 IEEE International Electron Devices Meeting (IEDM), Department of Electrical Engineering and Computer Sciences, Dec. 2021, 4 pages.

Sharma, Abhishek A., et al., "High Speed Memory Operation in Channel-Last, Back-gated Ferroelectric Transistors", IEEE International Electron Devices Meeting (IEDM), doi: 10.1109/IEDM13553.2020.9371940., 2020, pp. 18.5.1-18.5.4.

Si, Mengwei, et al., "Why In2O3 Can Make 0.7 nm Atomic Layer Thin Transistors?", available at https://arxiv.org/ftp/arxiv/papers/2012/2012.12433.pdf, School of Electrical and Computer Engineering and Birck Nanotechnology Center, Purdue University, West Lafayette, IN 47907, United States, 2012, pp. 1-26.

Sun, Chen, "First Demonstration of BEOL-Compatible Ferroelectric TCAM Featuring a-IGZO Fe-TFTs with Large Memory Window of 2.9 V, Scaled Channel Length of 40 nm, and High Endurance of $10^\wedge$Cycles", 2021 Symposium on VLSI Technology Digest of Technical Papers, Kyoto, doi: 978-4-86348-779-6., Jun. 2021, 2 pages.

Tan, Ava J., et al., "Experimental Demonstration of a Ferroelectric HfO2-Based Content Addressable Memory Cell", IEEE Electron Device Letters, vol. 41, No. 2, doi: 10.1109/LED.2019.2963300., Feb. 2020, pp. 240-243.

Tan, Ava Jiang, et al., "Ferroelectric HfO2 Memory Transistors with High-κ Interfacial Layer and Write Endurance Exceeding 1010 Cycles", arXiv:2103.08806 [physics.app-ph], available at https://arxiv.org/abs/2103.08806., Mar. 16, 2021.

Tan, Ava J., et al., "Hot Electrons as the Dominant Source of Degradation for Sub-5nm HZO FeFETs", IEEE Symposium on VLSI Technology, Honolulu, HI, USA, doi: 10.1109/VLSITechnology18217.2020.9265067., 2020, pp. 1-2.

"EP Extended Search Report EP168690149.3", Oct. 18, 2019.

"European Search Report, EP 16852238.1", Mar. 28, 2019.

"European Search Report, EP17844550.8", Aug. 12, 2020, 11 pages.

"Imec Demonstrates Capacitor-less IGZO-Based DRAM Cell With >400s Retention Time", IMEC, Press release, available at https://www.imec-int.com/en/press/imec-demonstrates-capacitor-less-igzo-based-dram-cell-400s-retention-time, Dec. 15, 2020, 15 pages.

"Invitation to Pay Additional Fees (PCT/ISA/206), PCT/US2020/015710", Mar. 20, 2020, 2 pages.

"Notification of Reasons for Refusal, Japanese Patent Application 2018-527740", (English translation), Nov. 4, 2020, 8 pages.

"Partial European Search Report EP 16869049.3", Jul. 1, 2019, pp. 1-12.

"PCT Search Report and Written Opinion, PCT/US2018/038373", Sep. 10, 2018.

"PCT Search Report and Written Opinion, PCT/US2018/067338", May 8, 2019.

"PCT Search Report and Written Opinion, PCT/US2019/014319", Apr. 15, 2019.

"PCT Search Report and Written Opinion, PCT/US2019/041678", Oct. 9, 2019.

"PCT Search Report and Written Opinion, PCT/US2019/052164", Feb. 27, 2020.

"PCT Search Report and Written Opinion, PCT/US2019/052446", Dec. 11, 2019.

"PCT Search Report and Written Opinion, PCT/US2020/015710", Jun. 9, 2020.

"PCT Search Report and Written Opinion, PCT/US2020/017494", Jul. 20, 2020, 13 pages.

"PCT Search Report and Written Opinion, PCT/US2020/065374", Mar. 15, 2021, 17 pages.

"PCT Search Report and Written Opinion, PCT/US2020/065670", Apr. 5, 2021, 12 pages.

"PCT Search Report and Written Opinion, PCT/US2021/016964", Jun. 15, 2021, 19 pages.

"PCT Search Report and Written Opinion, PCT/US2021/025722", Jun. 15, 2021, 10 pages.

"PCT Search Report and Written Opinion, PCT/US2021/064844", Mar. 8, 2022, 15 paged.

"PCT Search Report and Written Opinion, PCT/US2021/42620", Oct. 28, 2021, 18 pages.

"PCT Search Report and Written Opinion, PCT/US2022/016729", Applicant: SunRise Memory Corporation, May 17, 2022, 20 pages.

Ahn, Min-Ju, et al., "Transparent multi-level-cell nonvolatile memory with dual-gate amorphous indiumgallium-zinc oxide thin-film transistors", Appl. Phys. Lett. 109, 252106; doi: 10.1063/1.4972961., 2016, 6 pages.

Alessandri, Cristobal, et al., "Monte Carlo Simulation of Switching Dynamics in Polycrystalline Ferroelectric Capacitors", IEEE Transactions on Electron Devices, vol. 66, No. 8, doi: 10.1109/TED.2019.2922268., Aug. 2019, pp. 3527-3534.

Ali, T., et al., "A Multilevel FeFET Memory Device based on Laminated HSO and HZO Ferroelectric Layers for High-Density

(56) References Cited

OTHER PUBLICATIONS

Storage", IEEE International Electron Devices Meeting (IEDM), 2019, doi: 10.1109/IEDM19573.2019.8993642., Dec. 2019, pp. 28.7.1-28.7.4.
Ali, T., et al., "High Endurance Ferroelectric Hafnium Oxide-Based FeFET Memory Without Retention Penalty,", IEEE Transactions on Electron Devices, vol. 65, No. 9, doi: 10.1109/TED.2018.2856818.—paper cited in Bae (Berkeley) paper, Sep. 2018, pp. 3769-3774.
Bae, Jong-Ho, et al., "Highly Scaled, High Endurance, Ω-Gate, Nanowire Ferroelectric FET Memory Transistors", IEEE Electron Device Letters, vol. 41, No. 11, doi: 10.1109/LED.2020.3028339.—Sayeef-Berkeley paper on FeFET memory, Nov. 2020, pp. 1637-1640.
Beyer, Sven, et al., "FeFET: A versatile CMOS compatible device with game-changing potential", IEEE International Memory Workshop (IMW), doi: 10.1109/IMW48823.2020.9108150., 2020, pp. 1-4.
Böscke, T.S., et al., "Ferroelectricity in hafnium oxide: CMOS compatible ferroelectric field effect transistors", 2011 International Electron Devices Meeting, Washington, DC, USA, doi: 10.1109/IEDM.2011.6131606., 2011, pp. 24.5.1-24.5.4.
Chang, Sou-Chi, et al., "Anti-ferroelectric HfxZr1-xO2 Capacitors for High-density 3-D Embedded-DRAM", IEEE International Electron Devices Meeting (IEDM), doi: 10.1109/IEDM13553.2020.9372011., 2020, pp. 28.1.1-28.1.4.
Cho, Min Hoe, et al., "Achieving a Low-Voltage, High-Mobility IGZO Transistor through an ALD-Derived Bilayer Channel and a Hafnia-Based Gate Dielectric Stack", ACS Applied Materials & Interfaces, Apr. 1, 2021, 13 (14), , DOI: 10.1021/acsami.0c22677, 2021, pp. 16628-16640.
Cho, Min Hoe, et al., "Comparative Study on Performance of IGZO Transistors With Sputtered and Atomic Layer Deposited Channel Layer", IEEE Transactions on Electron Devices, vol. 66, No. 4, doi: 10.1109/TED.2019.2899586., Apr. 2019, pp. 1783-1788.
Choi, Seonjun, et al., "A novel three-dimensional NAND flash structure for improving the erase performance", IEICE Electronics Express, 2019 vol. 16 Issue 3, 2019, 6 pages.
De, Sourav, et al., "Ultra-Low Power Robust 3bit/cell Hf0.5Zr0.5O2 Ferroelectric FinFET with High Endurance for Advanced Computing-In-Memory Technology", 2021 Symposium on VLSI Technology, Kyoto, Japan, Jun. 13-19, 2021, Jun. 2021, 2 pages.
Dünkel, "A FeFET based super-low-power ultra-fast embedded NVM technology for 22nm FDSOI and beyond", IEEE International Electron Devices Meeting (IEDM), San Francisco, CA, USA, 2017, doi: 10.1109/IEDM.2017.8268425., 2017, pp. 19.7.1-19.7.4.
Dutta, Sourav, et al., "Logic Compatible High-Performance Ferroelectric Transistor Memory", available at https://arxiv.org/abs/2105.11078, Department of Electrical Engineering, University of Notre Dame, Notre Dame, IN 46556, USA, May 24, 2021, 28 pages.
Florent, K., "First demonstration of vertically stacked ferroelectric Al doped HfO2 devices for NAND applications", Symposium on VLSI Technology, doi: 10.23919/VLSIT.2017.7998162., 2017, pp. T158-159.
Florent, K., et al., "Vertical Ferroelectric HfO2 FET based on 3-D Nand Architecture: Towards Dense Low-Power Memory", IEEE International Electron Devices Meeting (IEDM), San Francisco, CA, 2018, doi: 10.1109/IEDM.2018.8614710., 2018, pp. 2.5.1-2.5.4.
Hendy, Ian, "The Role of Increased Semiconductor Mobility—an IGZO Case Study", Display Daily, available at https://www.displaydaily.com/article/display-daily/the-role-of-increased-semiconductor-mobility-an-igzo-case-study, Apr. 2021, 11 pages.
Hou, S. Y., et al., "Wafer-Level Integration of an Advanced Logic-Memory System Through the Second-Generation CoWoS Technology", IEEE Transactions on Electron Devices, vol. 64, No. 10, Oct. 2017, 4071-4077.
Hsain, Hanan Alexandra, et al., "Many routes to ferroelectric HfO2: A review of current deposition methods", J. Vac. Sci. Technol. A 40, 010803 (2022), published Dec. 1, 2021., Dec. 1, 2021, pp. 010803-1-010803-36.
Jeewandara, Thamarasee, et al., "High-speed 3-D memory with ferroelectric NAND flash memory", available at https://techxplore.com/news/2021-01-high-speed-d-memoryferroelectric-nand.html, Jan. 26, 2021, 5 pages.
Kawai, H., et al., "Design Principle of Channel Material for Oxide-Semiconductor Field-Effect Transistor with High Thermal Stability and High On-current by Fluorine Doping", IEEE International Electron Devices Meeting (IEDM), doi: 10.1109/IEDM13553.2020.9372121., 2020, pp. 22.2.1-22.2.4.
Kim, Min-Kyu, et al., "CMOS-compatible ferroelectric NAND flash memory for high-density, low-power, and high-speed three-dimensional memory", Science Advances, vol. 7, No. 3, eabe 1341, DOI: 10.1126/sciadv.abe1341. (Replacement of polysilicon channel material—use IZO for channel), Jan. 13, 2021, 10.
Kim, Taeho, et al., "Effects of high pressure nitrogen annealing on ferroelectric Hf0.5Zr0.5O2 films", Appl. Phys. Lett. 112, 092906 https://doi.org/10.1063/1.5003369, Mar. 2, 2018, 5 pages.
Kim, N., et al., "Multi-layered Vertical gate NANO Flash Overcoming Stacking Limit for Terabit Density Storage", Symposium on VLSI Tech. Dig. of Technical Papers, 2009, pp. 188-189.
Kunitake, Hitoshi, et al., "High-temperature Electrical Characteristics of 60nm CAAC-IGZO FET : Comparison with Si FET", International Conference on Solid State Devices and Materials, https://doi.org/10.7567/SSDM.2018.N-3-04, Sep. 2018, pp. 787-788.
Lee, Sang Yeol, "Comprehensive Review on Amorphous Oxide Semiconductor Thin Film Transistor", Trans. Electr. Electron. Mater. 21, https://doi.org/10.1007/s42341-020-00197-w, Mar. 28, 2020, pp. 235-248.
Lee, Chea-Young, et al., "Etching Characteristics and Changes in Surface Properties of IGZO Thin Films by O2 Addition in CF4/Ar Plasma", Coatings. 2021, 11(8):906. https://doi.org/10.3390/coatings11080906, Jul. 29, 2021.
Liao, P.J., et al., "Characterization of Fatigue and Its Recovery Behavior in Ferroelectric HfZrO", 2021 Symposium on VLSI Technology, Jun. 2021, 2 p.

\* cited by examiner

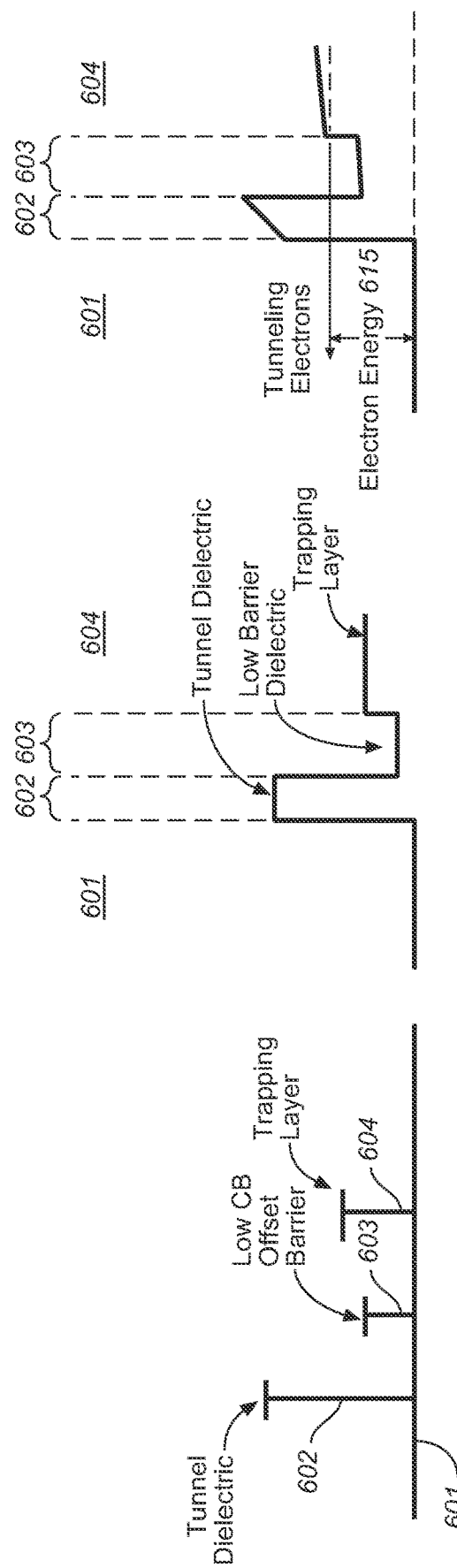

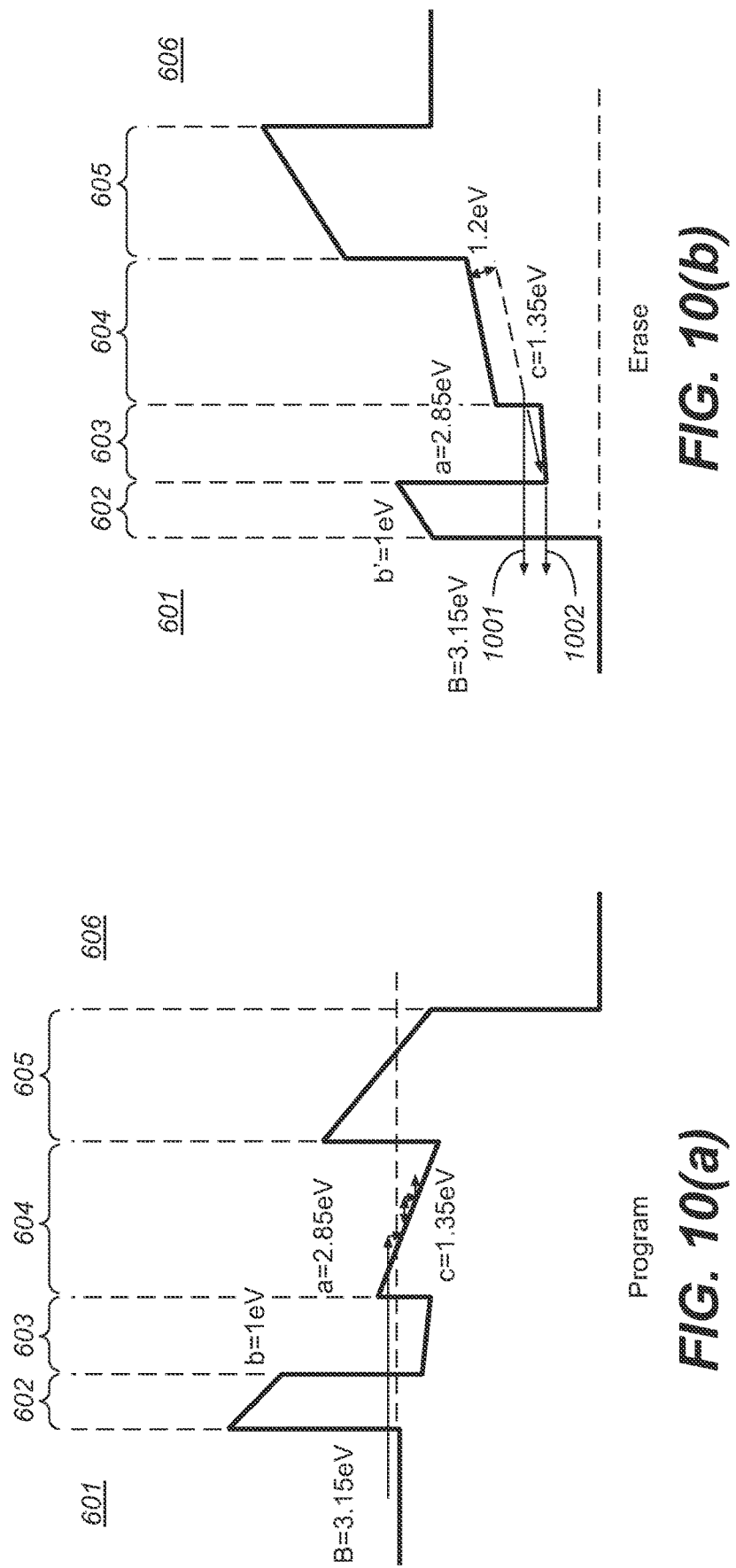

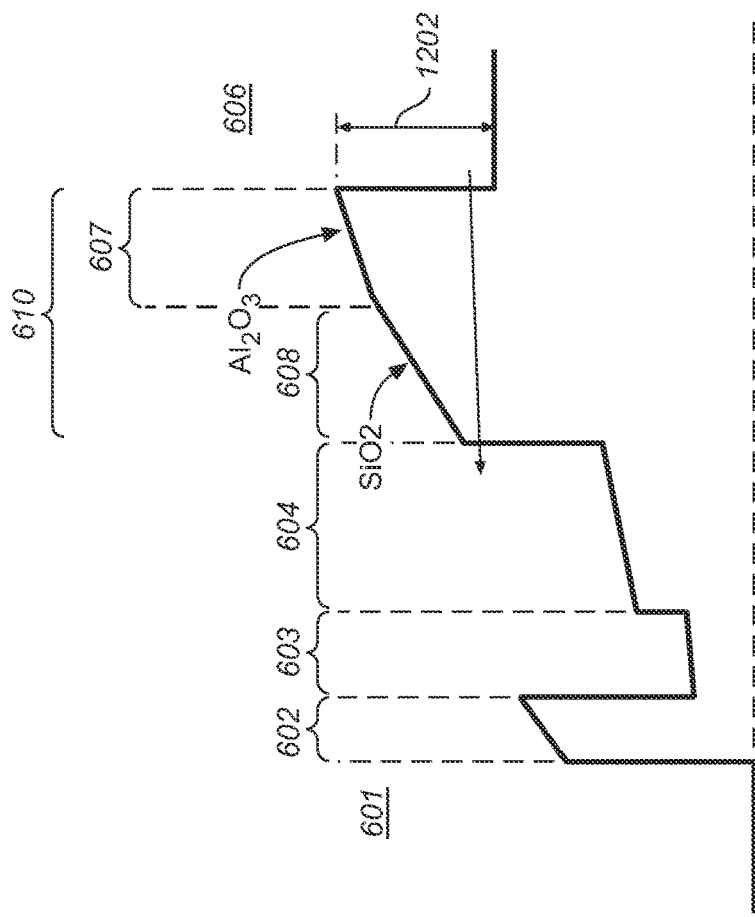
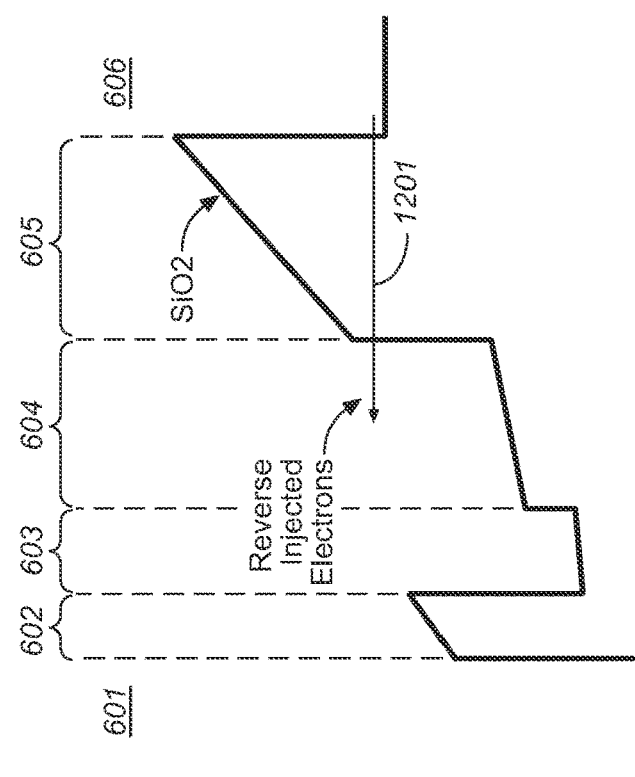
FIG. 12(a)
FIG. 12(b)

COOL ELECTRON ERASING IN THIN-FILM STORAGE TRANSISTORS

CROSS REFERENCE TO RELATED APPLICATIONS

The present application is a continuation application of U.S. patent application ("Parent Application"), Ser. No. 17/155,673, entitled "Cool Electron Erasing In Thin-film Storage Transistors," filed on Jan. 22, 2021, which is related to and claims priority of: (i) U.S. provisional patent application ("Provisional Application I"), Ser. No. 62/964,472, entitled "Cool Electron Erasing In Thin-film Storage Transistors," filed on Jan. 22, 2020, and (ii) U.S. provisional patent application ("Provisional Application II"), Ser. No. 62/992,754, entitled "Cool Electron Erasing In Thin-film Storage Transistors," filed on Mar. 20, 2020. The disclosures of Parent Application, and the Provisional Applications I and II are hereby incorporated by reference in their entireties.

BACKGROUND OF THE INVENTION

1. Field of the Invention

The present invention relates to programming and erasing schemes in thin-film storage transistors. In particular, the present invention relates to using cool electrons for fast programming and fast erase operations in a thin-film transistor, which also provides the additional benefit of achieving high endurance.

2. Discussion of the Related Art

U.S. Patent Application Publication 2019/0006015 ("Harari"), entitled "Capacitive-Coupled Non-Volatile Thin-Film Transistor Strings in Three-Dimensional Arrays," published on Jan. 3, 2019, discloses thin-film storage transistors organized as NOR memory strings. Harari's thin-film transistors may be programmed and erased in 100 nanosecond (ns) or less, rendering them suitable for use in many applications of conventional volatile memory devices, such as dynamic random-access memory (DRAM) devices. Harari's thin-film storage transistors also have an advantage of a retention time in minutes, rather than milliseconds, as typical of conventional DRAM devices. Therefore, one may refer to Harari's thin-film storage transistors as quasi-volatile storage transistors. In many applications, such a quasi-volatile storage transistor should preferably have a high endurance (e.g., in the range of $10^{11}$ cycles) and may preferably be programmed or erased using voltages of about 8-9 volts or lower.

Fast programming and fast erase operations require relatively high currents through the gate stack of the storage transistor. FIG. 1 is an energy band diagram of a portion of a storage transistor, which includes multiple sublayers of dielectric materials and stores charge between a channel region and a gate electrode. As shown in FIG. 1, various materials 120 between channel region 110 and gate electrode 114 allow data storage in the storage transistor. These materials include tunnel dielectric sublayer 111, charge-trapping sublayer 112 (e.g., silicon nitride) and blocking dielectric sublayer 113 (e.g., silicon oxide). Charge-trapping sublayer 112 and blocking dielectric sublayer 113 may each be, for example, 4 nm thick. In FIG. 1, line 101 traces the lowest energy states in the conduction bands of the various materials and line 102 traces the highest energy states in the valence bands of the various materials. In such a system, to change the threshold voltage of the storage transistor by one volt in 100 ns requires a programming current density of about 5.0 amps/cm$^2$. Using silicon dioxide as tunneling dielectric sublayer 111, such a high current density may be achieved at a moderate electric field in the range of 10.0 MV/cm through a direct tunneling mechanism.

FIG. 2 shows some typical direct tunneling current densities (gate currents) for various silicon dioxide thicknesses under different bias conditions. As shown in FIG. 2, the desired high current density (e.g., 5.0 amps/cm$^2$) may be achieved in silicon dioxide for thicknesses less than 1.5 nm, even for voltages below 1.5 volts across the silicon dioxide layer.

FIGS. 3(a) and 3(b) illustrate, respectively, direct tunneling of electrons into charge-trapping sublayer 112 and out of charge-trapping sublayer 112 during programming and erase operations. As illustrated in FIG. 3(a), the applied programming voltage across gate electrode 114 and channel region 110 lowers the conduction bands of tunnel dielectric sublayer 111, charge-trapping sublayer 112 and blocking dielectric sublayer 113 relative to channel region 110. Specifically, the lowest energy levels in the conduction band of charge-trapping sublayer 112 is lowered to slightly below that of channel region 110 to allow electrons with energy at the lowest energy levels of the conduction band in channel region 110 to direct-tunnel into charge-trapping sublayer 112, as illustrated by arrow 301 in FIG. 3(a).

Likewise, as illustrated in FIG. 3(b), the applied erase voltage across gate electrode 114 and channel region 110 raises the lowest energy levels in the conduction bands of tunnel dielectric sublayer 111, charge-trapping sublayer 112 and blocking dielectric sublayer 113 relative to those of channel region 110. The electric field imparts energy to electrons at the allowed energy levels of the charge-trapping sites in charge-trapping sublayer 112 to direct tunnel into channel region 110, as illustrated by arrow 302 in FIG. 3(b).

The direct tunneling mechanisms by electrons illustrated in FIGS. 3(a) and 3(b) allow fast programming and erase. In contrast, erasing by holes is a slow mechanism. In a floating-substrate quasi-volatile storage cell (e.g., Harari's thin-film storage transistor), for example, holes in channel region 110 are insufficient to provide an adequate hole current into charge-trapping sublayer 112; the likely erase mechanism for such a storage transistor pulls electrons out from charge-trapping sublayer 112.

In a storage transistor, the voltage difference between the threshold voltages of the storage transistor in the erased state and in the programmed state is referred to as the "programming window." The programming window narrows or closes with the number of cycles the storage transistor has been programmed and erased. Such programming window narrowing is due to, for example, degradation at the interface between channel region 110 and tunnel dielectric 111, as a result of interface states formation. Programming window narrowing may also result from charge-trapping at other material interfaces, e.g., between charge-trapping sublayer 112 and blocking dielectric sublayer 113. The endurance of a storage transistor refers to the number of program-erase cycles before the storage transistor fails to maintain an acceptable programming window. As illustrated in FIG. 3(a), electrons that direct tunnel from channel region 110 to charge-trapping sublayer 112 have low energy entering charge-trapping sublayer 112, so that they give up only a small amount of energy settling in the lowest allowed energy states in charge-trapping sublayer 112 (i.e., the lowest energy levels in the conduction bands of channel region 110 and charge-trapping sublayer 112 are very close in the presence of the programming voltage). This energy loss does not cause any appreciable damage to charge-trapping sublayer 112. In contrast, as illustrated in FIG. 3(b), the energy loss by electrons entering channel region 110 during an erase operation is significantly larger. The greater energy loss generates energetic holes ("hot holes") in channel region 110, which would be driven by the electric field of the erase voltage towards gate electrode 114. These hot holes create interface traps at the interface between channel region 110 and tunnel dielectric sublayer 111. These interface traps are detrimental to the endurance of the storage transistor and, in fact, may be primarily responsible for the programming window closing. One of ordinary skill in the art may also recognize that the hot holes phenomenon, known as the "anode hot hole injection mechanism," provides one model for dielectric breakdown.

FIG. 4 illustrates the evolution of the programming window in a storage transistor over more than $10^9$ program and erase cycles, showing program state threshold voltage 401 and erase state threshold voltage 402.

SUMMARY

According to one embodiment of the present invention, a storage transistor has a tunnel dielectric layer and a charge-trapping layer between a channel region and a gate electrode, wherein the charge-tapping layer has a conduction band offset—relative to a n-type silicon conduction band—that is less than the lowering of the tunneling barrier in the tunnel dielectric layer when a programming voltage is applied, such that electrons direct tunnel into the charge-trapping layer. The conduction band offset of the charge-trapping layer is selected to have a value between −1.0 eV and 2.3 eV. In some embodiments, the charge-tapping layer may include one or more of: hafnium oxide ($HfO_2$), yttrium oxide ($Y_2O_3$), silicon nitride ($Si_3N_4$), zirconium oxide ($ZrO_2$), zirconium silicon oxide ($ZrSiO_4$), lanthanum oxide ($La_2O_3$) tantalum oxide ($Ta_2O_5$), cerium oxide ($CeO_2$), titanium oxide ($TiO_2$), strontium titanium oxide ($SrTiO_3$), other semiconductors, and metal nanodots (e.g., silicon, ruthenium, platinum and cobalt nanodots).

According to one embodiment of the present invention, the storage transistor may further include a barrier layer between the tunnel dielectric layer and the charge-trapping layer, the barrier layer having a conduction band offset less than the conduction band offset of the charge-trapping layer. The barrier layer may also include a material having a conduction band offset between −1.0 eV and 2.3 eV, preferably between −1.0 eV to 1.5 eV, such as one or more of: hafnium oxide ($HfO_2$), yttrium oxide ($Y_2O_3$), silicon nitride ($Si_3N_4$), zirconium oxide ($ZrO_2$), zirconium silicon oxide ($ZrSiO_4$), tantalum oxide ($Ta_2O_5$), cerium oxide ($CeO_2$), titanium oxide ($TiO_2$), strontium titanium oxide ($SrTiO_3$), other semiconductors, and metal nanodots (e.g., silicon, ruthenium, platinum and cobalt nanodots).

In one embodiment, when a voltage substantially less than the programming voltage is applied across the channel region and the gate electrode, electrons tunnel into the charge-trapping layer by Fowler-Nordheim tunneling through an energy barrier that is wider than the thickness of the tunnel dielectric layer.

In one embodiment, the tunnel dielectric layer may be as thin as 5-40 Å and may be formed out of silicon oxide (e.g., $SiO_2$) or silicon nitride (SiN). A silicon oxide tunnel dielectric layer may be formed using conventional oxidation techniques (e.g., a high-temperature oxidation), chemical synthesis (e.g., atomic layer deposition (ALD)), or any suitable combination of these techniques. A reactive $O_2$ process may include ozone for a precisely controlled thickness and an improved oxide quality (e.g., reduced leakage due to defect sites). A silicon nitride tunnel dielectric layer may be formed using conventional nitridation, direct synthesis, chemical synthesis (e.g., by atomic layer deposition), or any suitable combination of these techniques. A plasma process may be used for a precisely controlled thickness and an improved dielectric quality (e.g., reduced leakage due to defect sites).

The tunnel dielectric layer may also include in addition a thin aluminum oxide ($Al_2O_3$) layer (e.g., 10 Å or less). The aluminum oxide layer in the tunnel dielectric layer may be synthesized in the amorphous phase, to reduce leakage due to defect sites.

The present invention is better understood upon consideration of the detailed description below in conjunction with the accompanying drawings.

BRIEF DESCRIPTION OF THE DRAWINGS

FIGS. 7(a), 7(b) and 7(c) show, respectively, (i) the relative conduction band offsets at substrate 601, tunnel dielectric 602, low conduction band offset (LCBO) barrier layer 603, and charge-trapping layer 604 of a storage transistor; (ii) an energy band diagram of these layers of the storage transistor without application of a voltage; and (iii) electron energy offset 615 between substrate 601 and charge-trapping layer 604, when an erase voltage is applied.

FIGS. 10(a) and 10(b) are band diagrams for the structure during programming and erase operations, based on a one-volt drop across tunnel dielectric layer 602 (i.e., b=1 eV, during a programming operation and b'=1 eV, during an erase operation).

FIG. 12(a) is an energy band diagram for the conduction band of a gate stack of a storage transistor during an erase operation.

FIG. 12(b) is an energy band diagram for the conduction band of a gate stack of a storage transistor during an erase operation, the storage transistor having additional aluminum oxide layer 607 in blocking dielectric layer 610, according to one embodiment of the present invention

DETAILED DESCRIPTION OF THE PREFERRED EMBODIMENTS

The present invention improves endurance in a storage transistor to exceed $10^{11}$ program-erase cycles using a device structure that ensures electrons tunneling out of a charge-trapping layer into the channel region of the storage transistor (e.g., during an erase operation) are within a desirable low energy range ("cool electrons"), such that any resulting hole generations are also low-energy and are thus less damaging to the programming window. The device structure provides a substantial direct tunneling programming current density exceeding 1.0 amps/cm$^2$ (e.g., 5.0 amps/cm$^2$). The present invention is particularly advantageous for use in storage layers of thin-film storage transistors that are formed in 3-dimensional memory structures, such as those quasi-volatile storage transistors in the 3-dimensional arrays of NOR memory strings disclosed in Harari discussed above.

Figure 1:
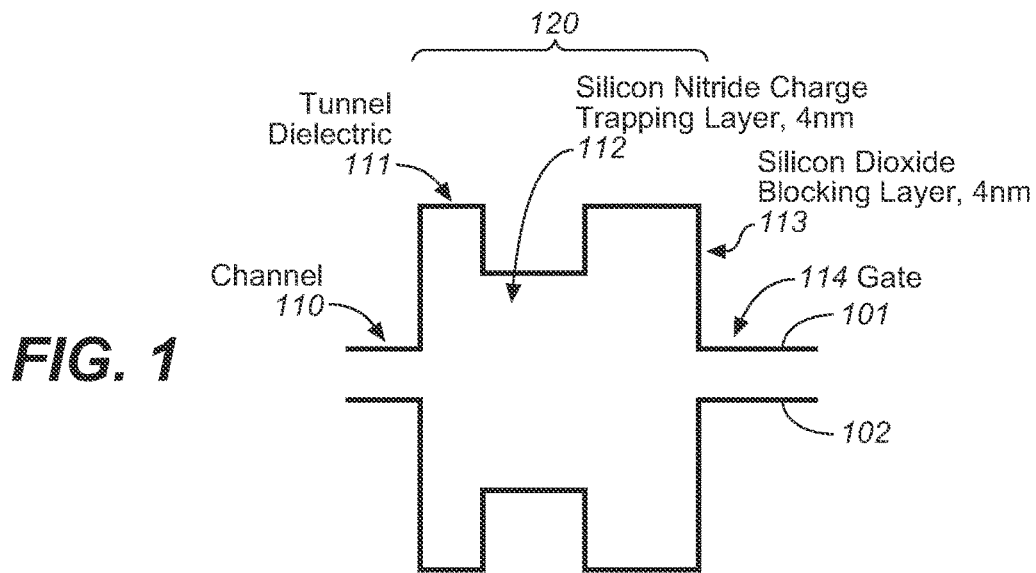
FIG. 1 is an energy band diagram of a conventional storage transistor, which includes multiple sublayers of dielectric materials and stores charge between a channel region and a gate electrode.
Figure 2:
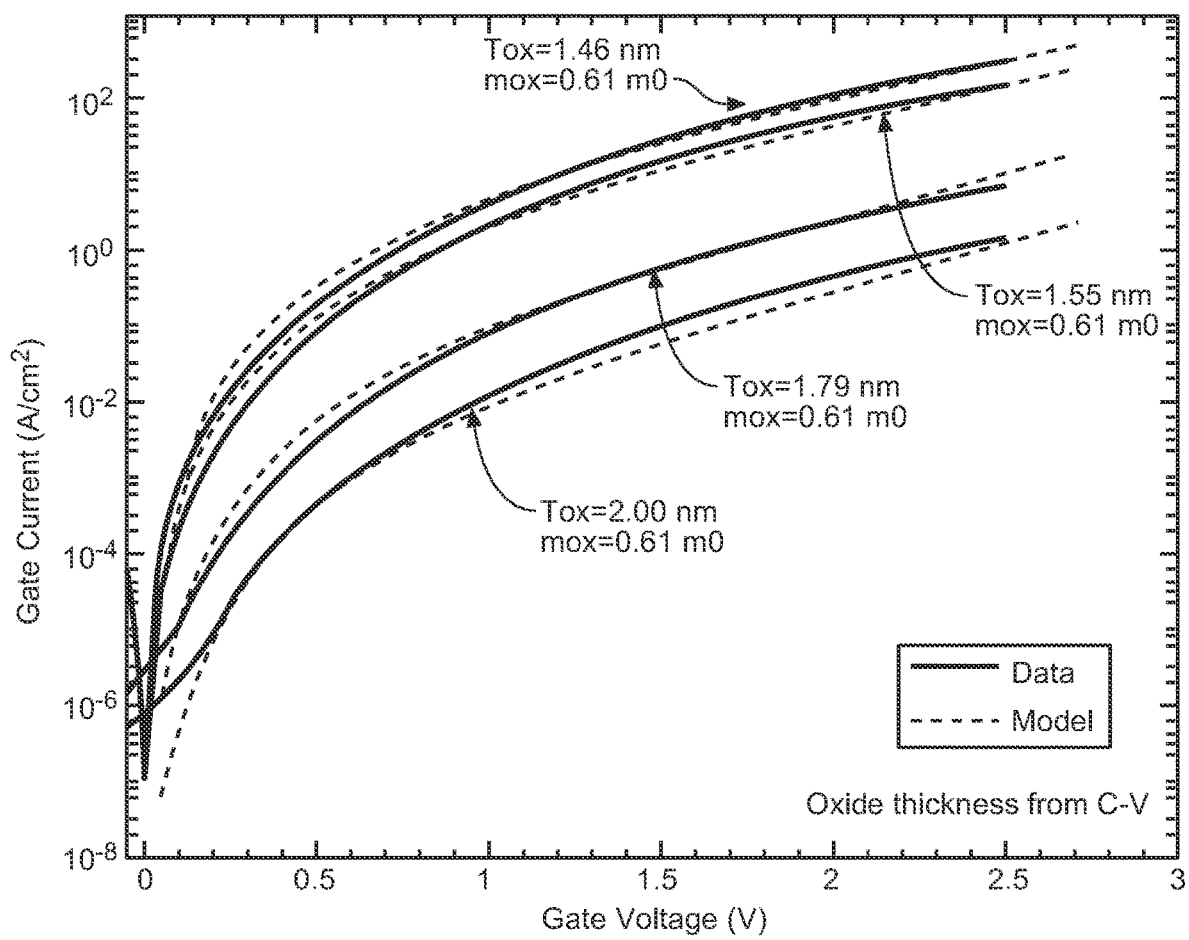
FIG. 2 shows some typical direct tunneling current densities (gate currents) for various silicon dioxide thicknesses under different bias conditions.
Figure 3A:
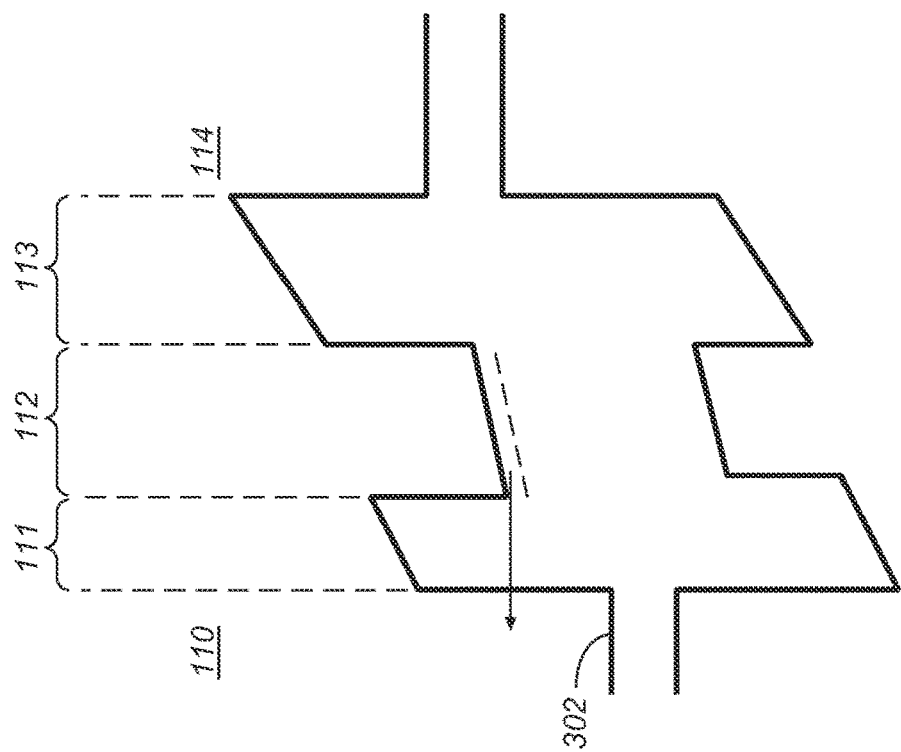
FIGS. 3(a) and 3(b) illustrate, respectively, direct tunneling of electrons into charge-trapping sublayer 112 and out of charge-trapping sublayer 112 during programming and erase operations.
Figure 3B:
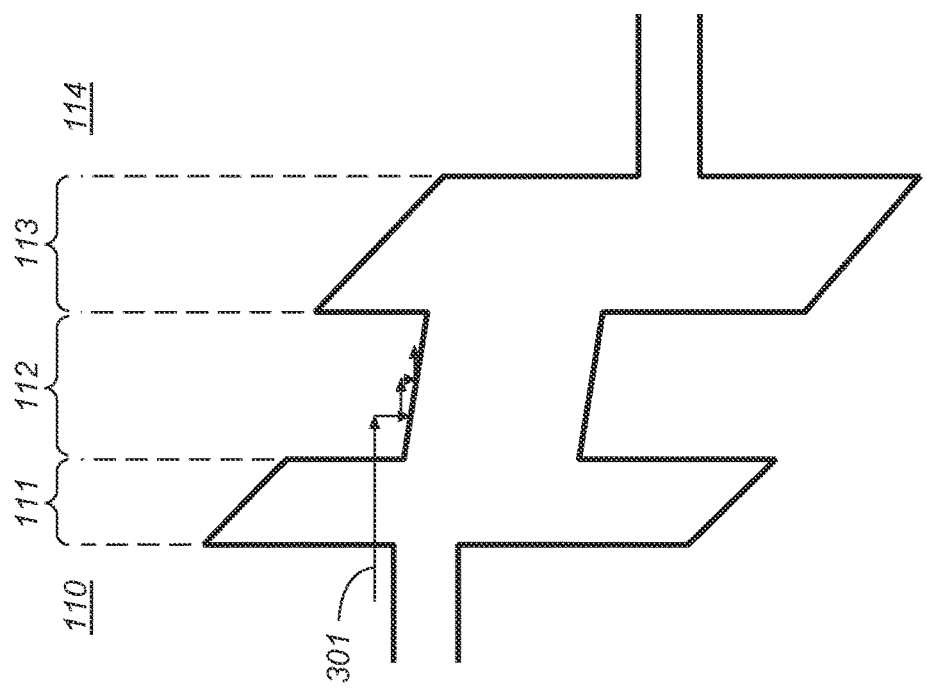
Figure 4:
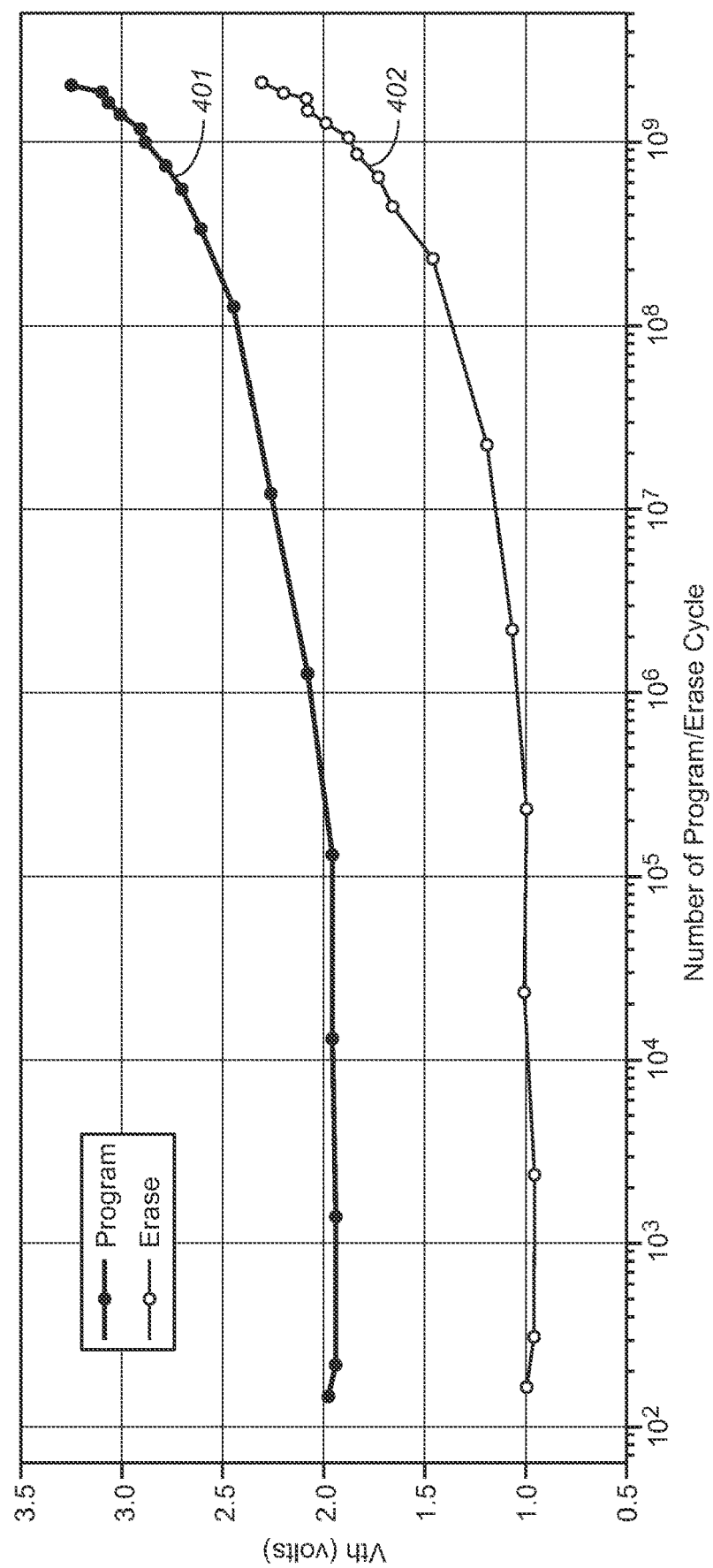
FIG. 4 illustrates an evolution of the programming window in a storage transistor over more than $10^9$ program and erase cycles, showing program state threshold voltage 401 and erase state threshold voltage 402.
Figure 5:
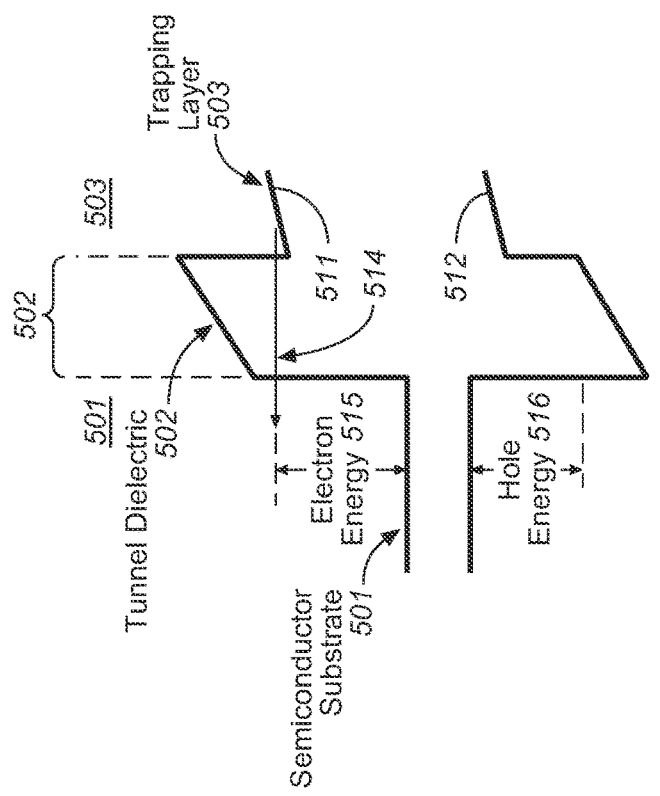
FIG. 5 is an energy band diagram in an exemplary storage transistor having channel region 501, tunnel dielectric layer 502 and charge-trapping layer 503.

One embodiment of the present invention is illustrated by the model of FIG. 5, showing the conduction and valence energy band boundaries 511 and 512 of an exemplary storage transistor having channel region 501, tunnel dielectric layer 502 and charge-trapping layer 503. As FIG. 5 illustrates, arrow 514 represents electrons direct tunnel from charge-trapping layer 503 to channel region 501. The energy difference ("conduction band offset") between the lowest energy levels in the conduction bands of charge-trapping layer 503 and channel region 501—indicated by reference numeral 515—is the expected energy loss by an electron so tunneled.

Figure 6C:
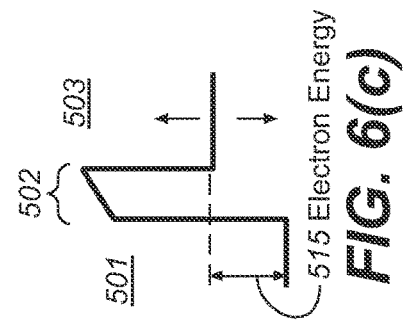
FIGS. 6(a), 6(b) and 6(c) show, respectively, (i) the lowest energy levels of the conduction bands at substrate 501, tunnel dielectric 502 and charge-trapping layer 503 of a storage transistor; (ii) the lowest energy levels in the conduction bands of these layers of the storage transistor without application of a voltage; and (iii) the electron energy offset 515 between substrate 501 and charge-trapping layer 503, when an erase voltage is applied.
Figure 6B:
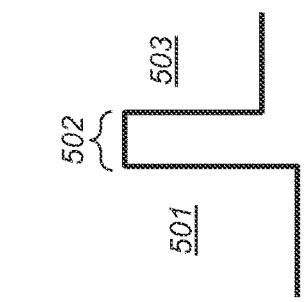
Figure 6A:
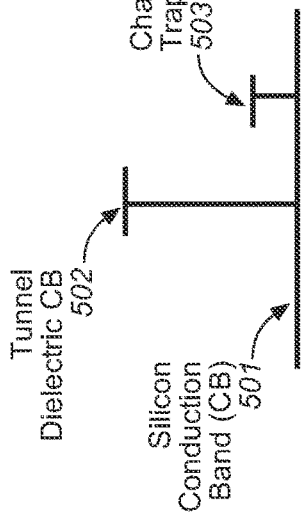

The present invention may be achieved by judiciously selecting a combination of materials for a tunnel dielectric material and a charge-trapping dielectric material, to obtain desirable conduction band offsets at these layers relative to the semiconductor substrate (i.e., the channel region) of the storage transistor. FIG. 6(a) shows the lowest energy levels of the conduction bands at substrate 501, tunnel dielectric 502 and charge-trapping layer 503 of the storage transistor. FIG. 6(b) shows the lowest energy levels in the conduction bands of these layers of the storage transistor without application of a voltage. FIG. 6(c) shows the electron energy offset 515 between substrate 501 and charge-trapping layer 503, when an erase voltage is applied. Electron energy offset 515 depends on conduction band offsets between substrate 501 and each of tunnel dielectric layer 502 and charge-trapping layer 503, as well as on the voltage applied for the erase operation. As illustrated in FIG. 6(c), for tunnel dielectric layer 502, using different charge-trapping materials as charge-trapping layer 503, with different conduction band offsets relative to the substrate layer 501, results in greater or lesser energy loss in the tunneling electrons reaching substrate 501. Likewise, for charge-trapping layer 503, using different tunnel dielectric materials as tunnel dielectric layer 502, with different conduction band offsets relative to the substrate layer 501, also results in greater or lesser energy loss in the tunneling electrons reaching substrate 501.

Tunnel dielectric layer 502 may be as thin as 5-40 Å and may be formed out of silicon oxide (e.g., SiO$_2$), silicon nitride (SiN), or silicon oxynitride (SiON). A silicon oxide tunnel dielectric layer may be formed using conventional oxidation techniques (e.g., a high-temperature oxidation), chemical synthesis (e.g., atomic layer deposition (ALD)), or any suitable combination of these techniques. A reactive O$_2$ process may include an ozone step (e.g., using pulsed ozone) for a precisely controlled thickness and an improved oxide quality (e.g., reduced leakage due to defect sites). The ozone step augments solidification of the oxide in a conformal manner, which is particularly advantageous for three-dimensional transistor structures. An annealing step (e.g., an H$_2$ anneal, a NH$_3$ anneal, or a rapid thermal annealing) may also fortify tunnel dielectric layer 502. A silicon nitride tunnel dielectric layer may be formed using conventional nitridation, direct synthesis, chemical synthesis (e.g., by ALD), or any suitable combination of these techniques. A plasma process may be used for a precisely controlled thickness and an improved dielectric quality (e.g., reduced leakage due to defect sites).

Tunnel dielectric layer 502 may also include an additional thin aluminum oxide (Al$_2$O$_3$) layer (e.g., 10 Å or less). This additional aluminum oxide layer in the tunnel dielectric layer may be synthesized in the amorphous phase, to reduce leakage due to defect sites.

The following materials may be used to provide tunnel dielectric layer 502 and charge-trapping layer 503:

| Material | Conduction Band Offset |
|---|---|
| Silicon oxide (SiO$_2$) | 3.15 eV |
| Hafnium oxide (HfO$_2$) | 1.5 eV |
| Silicon Nitride (Si$_3$N$_4$) | 2.4 eV |
| Yttrium oxide (Y$_2$O$_3$) | 2.3 eV |
| Zirconium oxide (ZrO$_2$) | 1.4 eV |
| Zirconium silicon oxide (ZrSiO$_4$) | 1; 5 eV |
| Lanthanum oxide (La$_2$O$_3$) | 2.3 eV |
| Silicon oxinitrides (SiN:H) | 1.3-2.4 eV |
| Tantalum oxide (Ta$_2$O$_5$) | 0.3 eV |
| Cerium oxide (CeO$_2$) | 0.6 eV |
| Titanium oxide (TiO$_2$) | 0.0 eV |
| Strontium titanium oxide (SrTiO$_3$) | 0.0 eV |
| Silicon-rich silicon nitride (SiN:Si) | 1.35 eV |
| Silicon nanodots | 0.0 eV |
| Ruthenium nanodots | 0.7 eV |
| Cobalt nanodots | 1.0 eV |

Using a lower conduction band offset in the charge-trapping layer provides an effective increase in tunneling barrier in the tunnel dielectric layer, resulting in improved data retention.

Alternatively, a barrier material of low conduction band offset may be introduced into the storage transistor between the tunnel dielectric layer and the charge-trapping layer. FIGS. 7(a)-7(c) are band diagrams representative of such a structure. FIG. 7(a) shows the relative conduction band offsets at substrate 601, tunnel dielectric 602, low conduction band offset barrier dielectric 603 and charge-trapping layer 604 of the storage transistor. FIG. 7(b) is an energy band diagram of these layers of the storage transistor without application of a voltage. FIG. 7(c) shows the electron energy offset 615 between substrate 601 and charge-trapping layer 604, when an erase voltage is applied. Electron energy offset 615 depends on conduction band offsets between substrate 601 and each of tunnel dielectric layer 602, low conduction band offset barrier layer 603 and charge-trapping layer 604, as well as on the voltage applied for the erase operation. As shown in FIGS. 7(a)-7(c), low conduction band offset (LCBO) barrier dielectric 603 preferably has a conduction band offset relative to substrate 601 that is lower than those of both tunnel dielectric layer 602 and charge-trapping layer 604. Judiciously choosing the materials for tunnel dielectric layer 602, LCBO barrier layer 603, and trapping layer 604, cool electron direct tunneling may be achieved for both program and erase operations, resulting in a high endurance in the storage transistor.

Figure 8C:
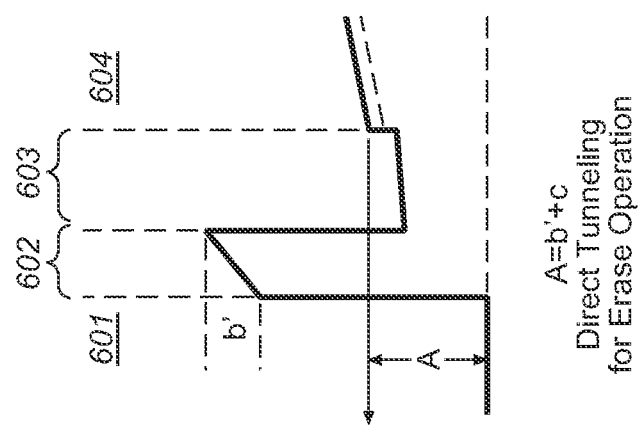
FIGS. 8(a), 8(b) and (c) illustrate the conduction band offset parameters for dielectric layers 602-604 illustrated in FIGS. 7(a)-7(c).
Figure 8B:
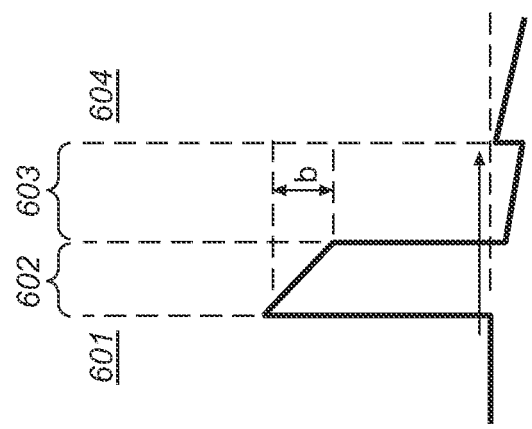
Figure 8A:
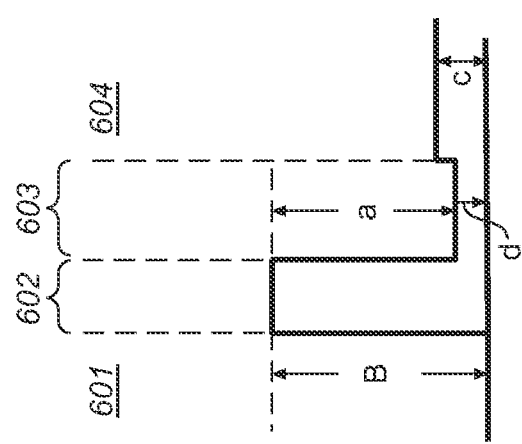

FIGS. 8(a)-(c) illustrate the conduction band offset parameters for dielectric layers 602-604 illustrated in FIGS. 7(a)-7(c). As shown in FIG. 8(a), (i) parameter B represents the conduction band offset of tunnel dielectric layer 602 relative to substrate 601, (ii) parameter a represents the conduction band offset of LCBO barrier layer 603 relative to the conduction band offset of tunnel dielectric layer 602, (iii) parameter d represents the conduction band offset of LCBO barrier layer 603 relative to substrate 601, and (iv) parameter c represents the conduction band offset of charge-trapping layer 604 relative to substrate 601. According to one embodiment of the present invention, the conduction band offset of LCBO barrier layer 603 should not be greater than the conduction band offset of charge-trapping layer 604 (i.e., d≤c) to allow a substantial direct tunneling programming current density exceeding 1.0 amps/cm$^2$ (e.g., 5.0 amps/cm$^2$).

FIG. 8(b) shows sloping of the energy level at the bottom of the conduction band of tunnel dielectric layer 602 as a result of the programming voltage. The sloping lowers the energy level of tunnel dielectric layer 602 by parameter b over the thickness of tunnel dielectric layer 602. For the programming operation to be effectuated by direct tunneling, the value of parameter b should be greater or equal to the value of parameter c (i.e., b≥c). The value of parameter b (in eV units) is the product of the voltage drop across tunnel dielectric layer 602 and the electron charge q (i.e., $1.6 \times 10^{-19}$ coulombs).

When the voltage drop across tunnel dielectric 602 is less than the conduction band offset of charge-trapping layer 604 (i.e., b<c), the tunneling barrier becomes wider, as at least a part of LCBO barrier layer 603 remains a tunneling barrier. In that case, direct tunneling may give way to a modified Fowler-Nordheim (MFN) mechanism, which provides a much smaller current than direct tunneling (e.g., less than 0.1 amps/cm$^2$).

Figure 9C:
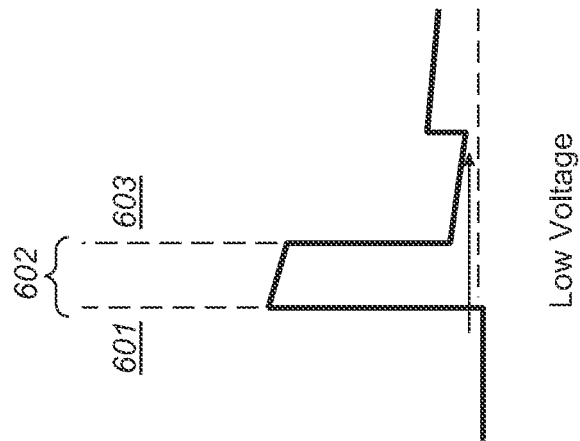
FIG. 9(a) illustrates direct tunneling and FIGS. 9(b) and 9(c) illustrate MFN tunneling in the storage transistor of FIGS. 7(a)-7(c).
Figure 9B:
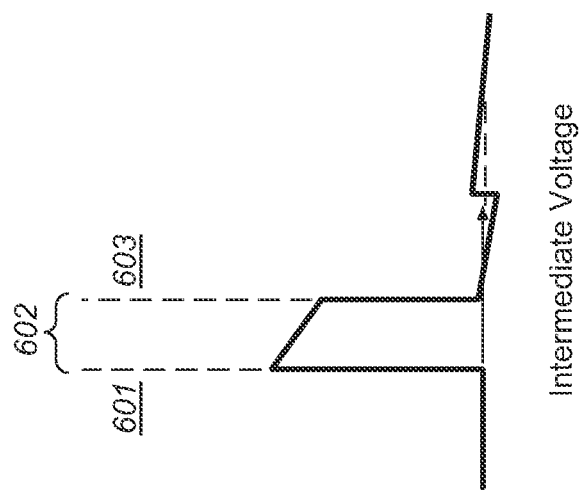
Figure 9A:
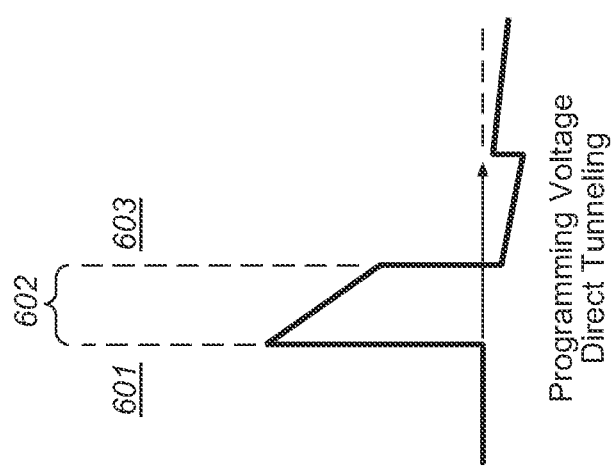

FIG. 9(a) illustrates direct tunneling, under application of a programming voltage, and FIGS. 9(b) and 9(c) illustrate MFN tunneling, under a lower voltage ("intermediate") and an even lower voltage, respectively, in the storage transistor of FIGS. 7(a)-7(c). One may recognize that MFN tunneling may occur in a region of low voltage disturbs during operations of the storage transistor. However, for a storage transistor having the structure illustrated in FIGS. 7(a)-7(c), this MFN tunneling current can be very low for a range of voltages applied. The materials and the thicknesses for charge-trapping layer 604 and barrier layer 603 are selected such that read disturb voltages, programming inhibit voltages or erase inhibit voltages fall within the range of low or intermediate voltages that restrict tunneling to the MFN mechanism.

Thus, the storage transistor of the present invention provides an important advantage: high currents at the programming voltage due to direct tunneling, while having merely a low MFN tunneling current when exposed to a low voltage. This characteristic reduces disturbs during read, programming inhibit, or erase inhibit operations and improves data retention and endurance, particularly in quasi-volatile storage transistors of the present invention that use direct tunneling for fast programming and fast erase operations. In this regard, LCBO barrier layer 603 improves endurance by enabling cool electron-erase operations, which reduces device degradation, as the resulting holes generated in the channel region are low-energy.

By restricting tunneling at low voltages to MFN tunneling, LCBO barrier layer 603 also improve data retention and reduces read disturb, programming-inhibit disturbs and erase-inhibit disturbs, as the read disturbs, programming-inhibit disturbs and erase-inhibit disturbs all occur at low voltages. For example, programming-inhibit disturbs and erase-inhibit disturbs occur at half-select or a lower voltage than that used in the respective programming and erase operations. All these benefits accrue in the storage transistors biased at low voltages, while at the same time maintaining the advantages of the high efficiency of direct tunneling accrue in the storage transistors biased at the higher read, programming or erase voltages.

FIG. 8(c) shows sloping of the energy level at the bottom of the conduction band of tunnel dielectric layer 602 during an erase operation. The sloping raises the energy level of tunnel dielectric layer 602 by parameter b' over the thickness of tunnel dielectric layer 602. During the erase operation, electrons in direct tunneling from charge-trapping layer 604 to substrate 601 loses an energy represented by parameter A, which is given by: A=b'+c. Note that the conduction band offset of charge-trapping layer 604 should be greater than the amount by which the energy level of a charge-trapping site is below the conduction band of charge-trapping layer 604 in order for the electrons at the charge-trapping site to be included in the direct tunneling current.

According to one embodiment of the present invention, substrate 601 may be implemented by a P-doped silicon, tunnel dielectric layer 602 may be implemented by a 1-nm thick SiO$_2$ layer (B=3.15 eV), low conduction band offset barrier layer 603 may be implemented by a 2-nm thick Ta$_2$O$_5$ layer (d=0.3 eV), charge-trapping layer 604 may be implemented by a 4-nm thick silicon-rich silicon nitride (i.e., SiN:Si; c=1.35 eV)[1], and another 4-nm thick SiO$_2$ layer may be used to provide a blocking dielectric layer. Gate electrode 606 may be implemented by a highly-doped P-type polysilicon. FIGS. 10(a) and 10(b) are band diagrams for the structure during programming and erase operations, based on a one-volt drop across tunnel dielectric layer 602 (i.e., b=1 eV, during a programming operation and b'=1 eV, during an erase operation). As shown in FIG. 10(b), as indicated by arrow 1001, an electron reaching substrate 601 by direct tunneling loses about 1.4 eV of energy during the erase operation. Scattering in LCBO barrier layer 603, as indicated by arrow 1002, may further reduce this energy loss.

[1] Unlike silicon nitride (stoichiometrically, Si$_3$N$_4$), silicon-rich silicon nitride includes silicon as impurity, which reduces silicon nitride's band gap from 4.6 eV to about 3.6 eV for silicon-rich silicon nitride. Also, silicon nitride has a refractive index of 2.0, while silicon-rich silicon nitride has a refractive index in the range of 2.1-2.3.

According to another embodiment of the present invention, substrate 601 may be implemented by a P-doped silicon, tunnel dielectric layer 602 may be implemented by a 1-nm thick SiO$_2$ layer (B=3.15 eV), low conduction band offset barrier layer 603 may be implemented by a 2-nm thick CeO$_2$ layer (d=0.6 eV), charge-trapping layer 604 may be implemented by a 4-nm thick silicon-rich silicon nitride (i.e., Si$_3$N$_{r4}$:Si; c=1.35 eV), and another 5-nm thick SiO$_2$ layer may be used to provide a blocking dielectric layer. Gate electrode 606 may be implemented by a highly-doped P-type polysilicon.

FIG. 11(a)-11(d) show various simulation results for storage transistors of the present invention.

Figure 11A:
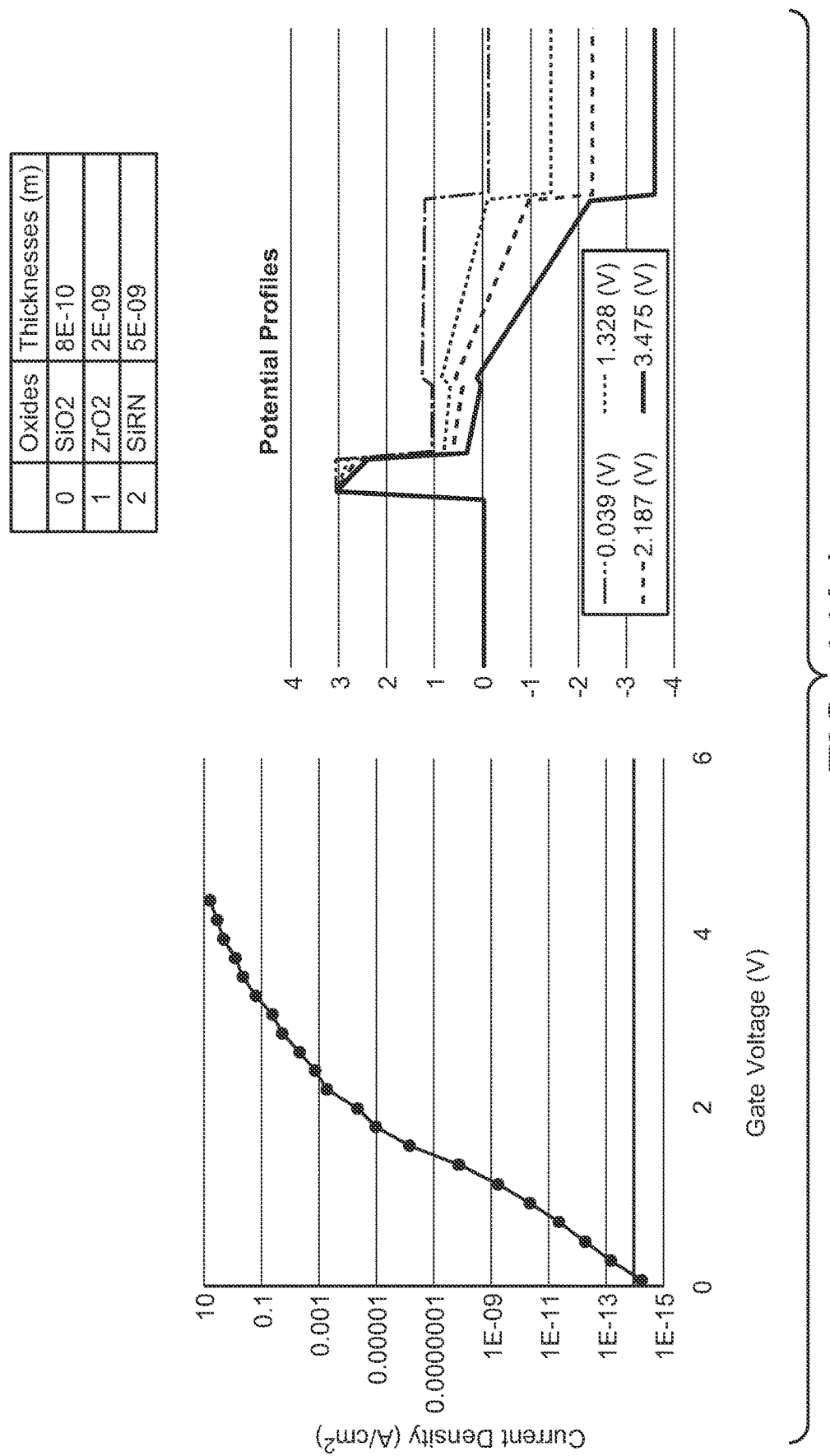
FIGS. 11(a), 11(b), 11(c) and 11(d) show various simulation results for storage transistors of the present invention.

FIG. 11(a) shows a simulation of a storage transistor having a 0.8 nm thick silicon oxide tunneling dielectric layer, a 2.0 nm thick zirconium oxide LCBO barrier layer and a 5.0 nm thick silicon-rich silicon nitride trapping layer. FIG. 11(a) shows that a direct-tunneling current density exceeding 1.0 amps/cm$^2$ is achieved with a programming voltage around 3.1 volts.

Figure 11B:
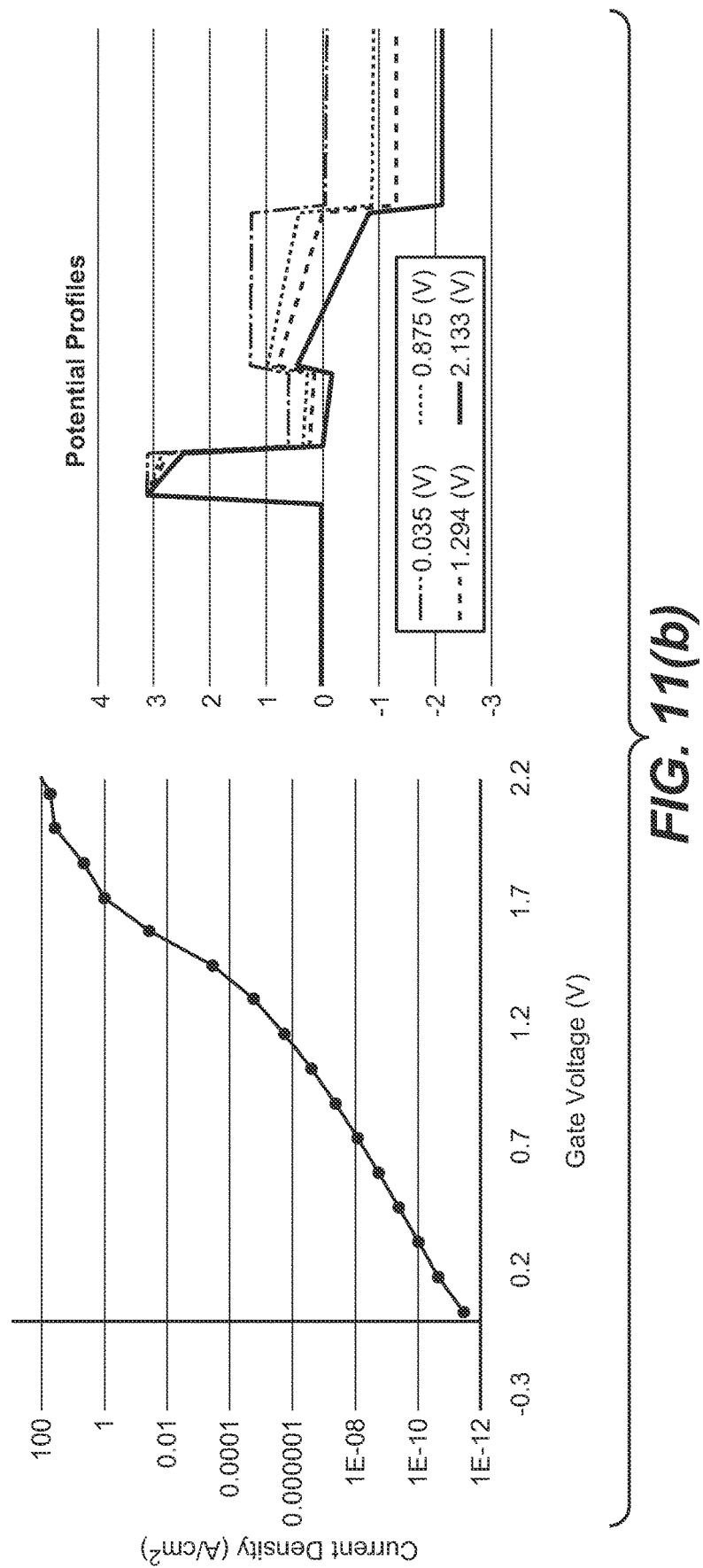

FIG. 11(b) shows a simulation of a storage transistor having a 1.0 nm thick silicon oxide tunneling dielectric layer, a 2.0 nm thick cerium oxide LCBO barrier layer and a 4.0 nm thick silicon-rich silicon nitride trapping layer. FIG. 11(b) shows that a direct-tunneling current density exceeding 1.0 amps/cm$^2$ is achieved with a programming voltage around 1.6 volts.

Figure 11C:
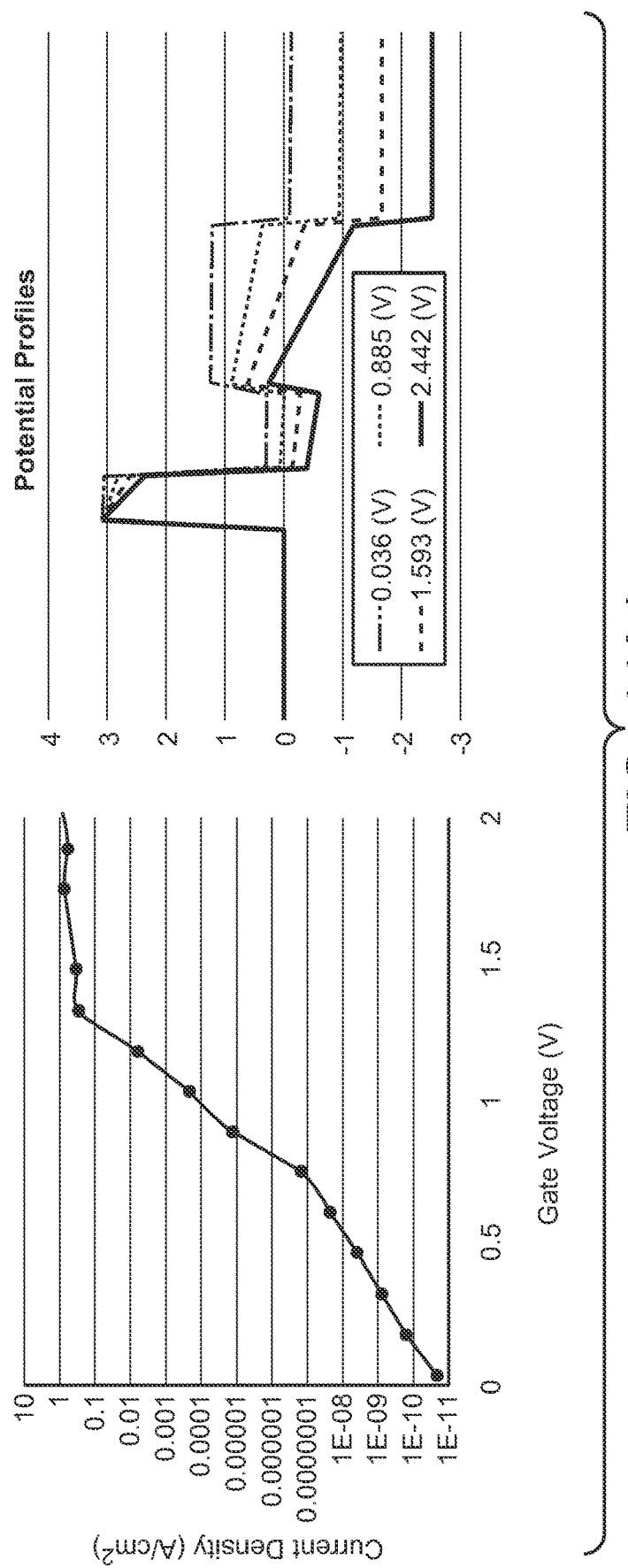

FIG. 11(c) shows a simulation of a storage transistor having a 1.0 nm thick silicon oxide tunneling dielectric layer, a 2.0 nm thick tantalum oxide LCBO barrier layer and a 4.0 nm thick silicon-rich silicon nitride trapping layer. FIG. 11(c) shows that a direct-tunneling current density exceeding 1.0 amps/cm$^2$ is achieved with a programming voltage around 1.8 volts.

Figure 11D:
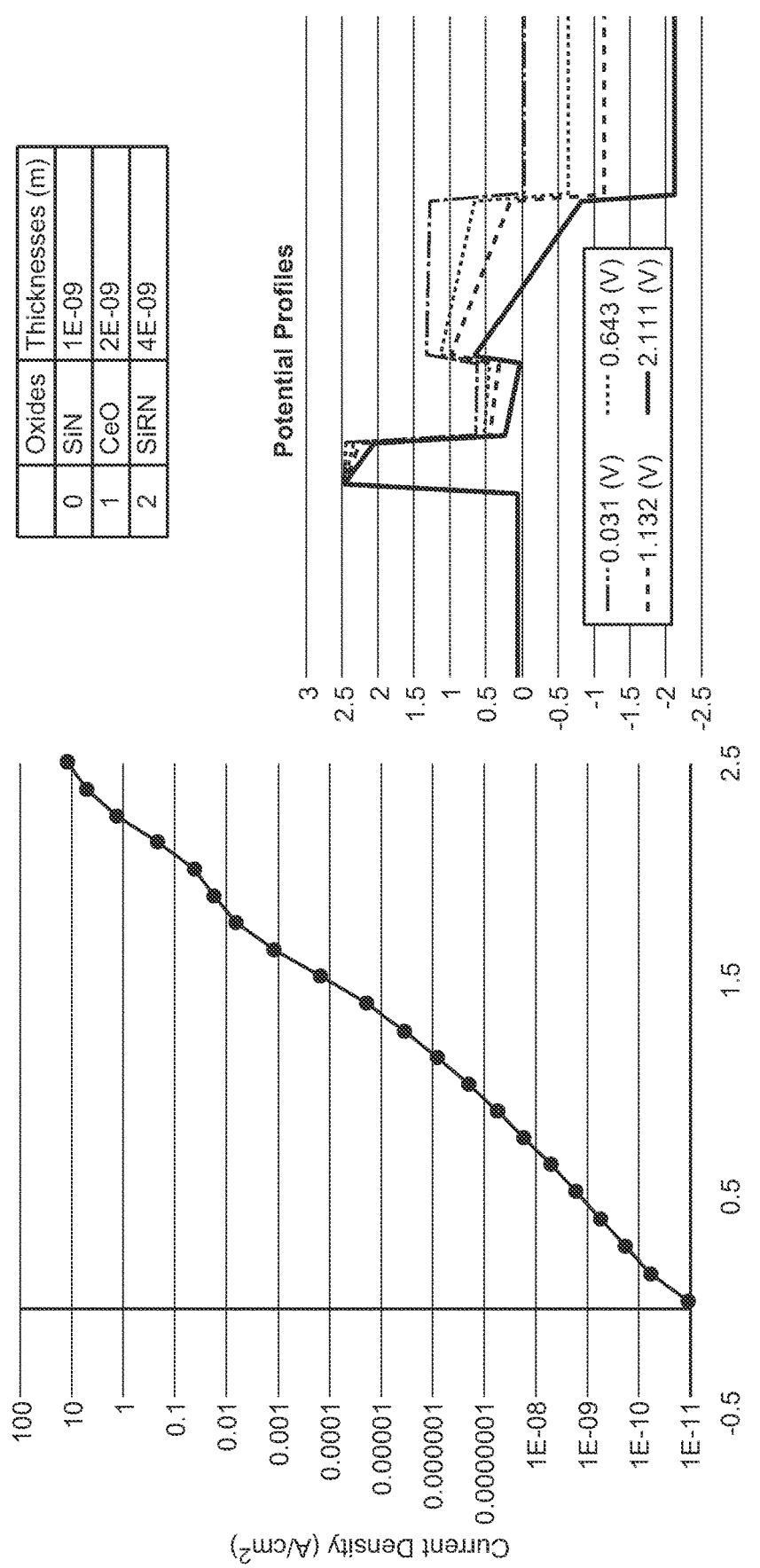

FIG. 11(d) shows a simulation of a storage transistor having a 1.0 nm thick silicon nitride tunneling dielectric layer, a 2.0 nm thick cerium oxide LCBO barrier layer and a 4.0 nm thick silicon-rich silicon nitride trapping layer. FIG. 11(d) shows that a direct-tunneling current density exceeding 1.0 amps/cm$^2$ is achieved with a programming voltage around 2.1 volts.

FIG. 12(a) illustrates a "reverse injection electrons" phenomenon that may occur during an erase operation. The reverse injection electrons may affect endurance adversely. FIG. 12(a) is an energy band diagram for the conduction band of a gate stack in a storage transistor during an erase operation. As shown in FIG. 12(a), the gate stack includes substrate 601, tunnel dielectric 602, LCBO barrier dielectric 603, charge-trapping layer 604, blocking dielectric layer 605 and gate electrode 606. (Blocking dielectric layer 605 may be, for example, silicon oxide ($SiO_2$)). During an erase operation, the relatively high electric field across blocking dielectric layer 605 may cause high-energy electrons—indicated in FIG. 12(a) by arrow 1201—to tunnel from the gate electrode into charge-trapping layer 604, or even into tunnel dielectric layer 602. These reverse injection electrons may damage these layers, adversely affecting the storage transistor's endurance.

According to one embodiment of the present invention, reverse injection electrons may be significantly reduced or substantially eliminating by including a layer of material with a high dielectric constant ("high-k material"), such as aluminum oxide ($Al_2O_3$) in the blocking dielectric layer (e.g., blocking dielectric layer 605 of FIG. 10(a)). In that embodiment, a high work function metal (e.g., greater than 3.8 eV, preferably not less than 4.0 eV) may be used for gate electrode. A high-k material of $t_H$ provides an equivalent oxide thickness $t_{EOT}$ given by:

$$t_{EOT} = t_H \times \frac{\kappa_{ox}}{\kappa_H}$$

where $\kappa_{ox}$ and $\kappa_H$ are the relative dielectric constants of silicon oxide and the high-k material, respectively. Thus, a high-k material can provide the same desirable transistor characteristics (e.g., gate capacitance) at a thickness of $t_H$, without incurring undesirable leakage of its silicon oxide layer counterpart at the much thinner equivalent thickness $t_{EOT}$.

FIG. 12(b) is an energy band diagram for the conduction band of a gate stack in a storage transistor during an erase operation, the storage transistor having additional aluminum oxide layer 607 in blocking dielectric layer 610, according to one embodiment of the present invention. In FIG. 12(b), blocking dielectric layer 610 includes aluminum oxide layer 607 and silicon oxide layer 608. In one implementation, blocking dielectric layer 610 has an equivalent oxide thickness that is substantially the same as blocking layer dielectric 605 of FIG. 12(a). However, as aluminum oxide has a relative dielectric constant of 9.0, while silicon oxide's relative dielectric constant is 3.9, the actual combined physical thickness of aluminum oxide 607 and silicon oxide 608 in FIG. 12(b) is greater than the thickness of blocking dielectric layer 605 of FIG. 12(a). Because high-k dielectric layer 607 has a greater relative dielectric constant than silicon oxide layer 608, the electric field is lower in high-k dielectric layer 607 than in silicon oxide layer 608. The greater combined physical thickness of blocking dielectric layer 610 of FIG. 12(b)—which provides a wider tunneling barrier between gate electrode 606 and charge-trapping layer 604—and a lower electric field at the interface between gate electrode 606 and high-k material 607 reduce or eliminate reverse injection electrons, thereby resulting in an improved endurance. With high-k electric layer 607 (e.g., aluminum oxide), a high work function metal is preferred for gate electrode 606. The high work function metal creates a high barrier (indicated by barrier height 1202 in FIG. 12(b)) at the gate electrode-aluminum oxide interface, which significantly reduces reverse electron injection the erase operation. Suitable high work function metals include: tungsten (W), tantalum nitride (TaN), tantalum silicon nitride (TaSiN).

The detailed description above is provided to illustrate specific embodiments of the present invention and is not intended to be limiting. Numerous variations and modifications within the scope of the present invention are possible. The present invention is set forth in the accompanying claims.

We claim:

1. A storage transistor, comprising: a channel region, a gate electrode, a tunnel dielectric layer, a data storage layer, and a barrier layer, wherein (i) the tunnel dielectric layer, the data storage layer, and the barrier layer are provided between the channel region and the gate electrode, (ii) the data storage layer has a conduction band offset that is less than a change in energy level over a thickness of the tunnel dielectric layer, when a programming voltage is applied between the gate electrode and the channel region, such that electrons direct tunnel into the data storage layer; and (iii) the barrier layer has a conduction band offset less than the conduction band offset of the data storage layer.

2. The storage transistor of claim 1, wherein the data storage layer comprises a charge-trapping layer.

3. The storage transistor of claim 1, wherein the barrier layer is provided between the tunnel dielectric layer and the data storage layer.

4. The storage transistor of claim 1, wherein the conduction band offset of the data storage layer is between −1.0 eV and 2.3 eV.

5. The storage transistor of claim 1, wherein the data storage layer comprises a material selected from the group consisting of: hafnium oxide ($HfO_2$), yttrium oxide ($Y_2O_3$), zirconium oxide ($ZrO_2$), zirconium silicon oxide ($ZrSiO_4$), lanthanum oxide ($La_2O_3$) tantalum oxide ($Ta_2O_5$), cerium oxide (CeO$_2$), titanium oxide (TiO$_2$), strontium titanium oxide (SrTiO$_3$), silicon nanodots, ruthenium nanodots, platinum nanodots and cobalt nanodots.

6. The storage transistor of claim 1, wherein the conduction band offset of the data storage layer is greater than the energy difference between a data storage site in the data storage layer and an edge of the conduction band of the data storage layer.

7. The storage transistor of claim 1, wherein the electrons that direct tunnel into the data storage layer provide a current exceeding 1.0 amps/cm$^2$.

8. The storage transistor of claim 1, wherein the tunnel dielectric layer has a thickness that allows programming and erasing operations to be accomplished predominantly by direct tunneling.

9. The storage transistor of claim 1, wherein the tunnel dielectric layer comprises one or more of: silicon oxide, silicon nitride and silicon oxynitride.

10. The storage transistor of claim 1, wherein the tunnel dielectric layer comprises stoichiometric silicon nitride.

11. The storage transistor of claim 9, wherein the tunnel dielectric layer comprises silicon oxide that is formed using an ozone step.

12. The storage transistor of claim 11, wherein the tunnel dielectric layer is formed using a pulsed ozone step, an H$_2$ anneal, a NH$_3$ anneal, a rapid thermal anneal, or any combination thereof.

13. The storage transistor of claim 11, further comprising in the tunnel dielectric layer a layer of aluminum oxide.

14. The storage transistor of claim 13, wherein the aluminum oxide layer has a thickness that is not greater than 1 nm.

15. The storage transistor of claim 1 wherein, when a voltage substantially less than the programming voltage is applied across the channel region and the gate electrode, electrons tunnel into the data storage layer by Fowler-Nordheim tunneling or a modified Fowler-Nordheim tunneling.

16. The storage transistor of claim 15, wherein the applied voltage corresponds to a programming inhibit voltage or an erase inhibit voltage and wherein electrons tunneling into the data storage layer provides a current density less than 0.1 amps/cm$^2$.

17. The storage transistor of claim 1, having an average endurance exceeding 10$^{11}$ programming-erase cycles.

18. The storage transistor of claim 1, wherein the barrier layer comprises a material having a conduction band offset between −1.00 eV and 1.5 eV.

19. The storage transistor of claim 16, wherein the barrier layer comprises a material selected from the group consisting of: hafnium oxide (HfO$_2$), yttrium oxide (Y$_2$O$_3$), zirconium oxide (ZrO$_2$), zirconium silicon oxide (ZrSiO$_4$), tantalum oxide (Ta$_2$O$_5$), cerium oxide (CeO$_2$), titanium oxide (TiO$_2$), silicon-rich silicon nitride (SiN:Si), strontium titanium oxide (SrTiO$_3$), silicon nanodots, ruthenium nanodots, platinum nanodots and cobalt nanodots.

20. The storage transistor of claim 16, wherein the tunnel dielectric layer comprises silicon oxide, the barrier layer comprises tantalum oxide, and the data storage layer comprises silicon-rich silicon nitride.

21. The storage transistor of claim 16, wherein the tunnel dielectric layer comprises silicon oxide, the barrier layer comprises cerium oxide, and the data storage layer comprises silicon-rich silicon nitride.

22. The storage transistor of claim 16, wherein the tunnel dielectric layer comprises silicon nitride, the barrier layer comprises cerium oxide, and the data storage layer comprises silicon-rich silicon nitride.

23. The storage transistor of claim 16, wherein the tunnel dielectric layer comprises silicon oxide, the barrier layer comprises zirconium oxide, and the data storage layer comprises silicon-rich silicon nitride.

24. The storage transistor of claim 16 wherein, when a voltage substantially less than the programming voltage is applied across the channel region and the gate electrode, electrons tunnel into the data storage layer by Fowler-Nordheim tunneling or a modified Fowler-Nordheim tunneling.

25. The storage transistor of claim 3, further comprising a blocking dielectric layer between the data storage layer and the gate electrode.

26. The storage transistor of claim 25, the blocking dielectric layer further comprises a layer of aluminum oxide.

27. The storage transistor of claim 26, wherein the aluminum oxide layer in the blocking dielectric layer has a thickness between 2 nm and 5 nm.

28. The storage transistor of claim 1, wherein the storage transistor is a quasi-volatile memory transistor.

29. The storage transistor of claim 28, wherein storage transistor is one of a plurality of thin-film storage transistors formed in a NOR memory string.

30. The storage transistor of claim 29, wherein the NOR memory string is one of a plurality of NOR memory strings in a 3-dimensional array.

31. The storage transistor of claim 1, wherein the storage transistor is a quasi-volatile memory transistor.

32. The storage transistor of claim 31, wherein storage transistor is one of a plurality of thin-film storage transistors formed in a NOR memory string.

33. The storage transistor of claim 32, wherein the NOR memory string is one of a plurality of NOR memory strings in a 3-dimensional array.

* * * * *